US012622299B2

(12) United States Patent
Otsubo et al.

(10) Patent No.: US 12,622,299 B2
(45) Date of Patent: May 5, 2026

(54) ELECTRONIC CIRCUIT MODULE

(71) Applicant: Murata Manufacturing Co., Ltd., Kyoto (JP)

(72) Inventors: Yoshihito Otsubo, Nagaokakyo (JP); Hirofumi Oie, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 340 days.

(21) Appl. No.: 18/472,608

(22) Filed: Sep. 22, 2023

(65) Prior Publication Data

US 2024/0014121 A1 Jan. 11, 2024

Related U.S. Application Data

(63) Continuation of application No. PCT/JP2022/006914, filed on Feb. 21, 2022.

(30) Foreign Application Priority Data

Apr. 8, 2021 (JP) ................................. 2021-065924

(51) Int. Cl.
*H10W 70/65* (2026.01)
*H10W 42/20* (2026.01)
(Continued)

(52) U.S. Cl.
CPC ........... *H10W 70/65* (2026.01); *H10W 42/20* (2026.01); *H10W 74/114* (2026.01);
(Continued)

(58) Field of Classification Search
CPC ......... H05K 1/02; H05K 1/0218–0219; H05K 1/0221; H05K 1/0227; H05K 1/14;
(Continued)

(56) References Cited

U.S. PATENT DOCUMENTS 6,084,780 A * 7/2000 Happoya ................ H05K 1/141
361/767
7,663,223 B2 * 2/2010 Pohl .................... H10W 70/688
257/668
(Continued)

FOREIGN PATENT DOCUMENTS

JP 2004-158595 A 6/2004
JP 2009-231383 A 10/2009
(Continued)

OTHER PUBLICATIONS

International Search Report for PCT/JP2022/006914 dated May 17, 2022.

*Primary Examiner* — Tuan T Dinh
(74) *Attorney, Agent, or Firm* — McDonald Hopkins LLC

(57) ABSTRACT

An electronic circuit module includes a substrate, a first electronic component mounted on one principal surface of the substrate, a substrate electrode provided on the one principal surface, a second electronic component supported by a support surface opposite to a surface of the first electronic component facing the one principal surface, a component electrode provided on a surface of the second electronic component, and a conductor including a connection part connecting the substrate electrode and the component electrode. The second electronic component includes a conductive portion electrically connected to the component electrode. The conductive portion is separated from a support surface of the first electronic component.

17 Claims, 11 Drawing Sheets

(51) Int. Cl.

| | | |
|---|---|---|
| *H10W 74/10* | (2026.01) | |
| *H10W 90/00* | (2026.01) | |
| *H03H 9/46* | (2006.01) | |
| *H10W 70/60* | (2026.01) | |
| *H10W 70/652* | (2026.01) | |

(52) U.S. Cl.
CPC .............. *H10W 90/00* (2026.01); *H03H 9/46* (2013.01); *H10W 70/60* (2026.01); *H10W 70/6523* (2026.01); *H10W 90/724* (2026.01)

(58) Field of Classification Search
CPC ..... H05K 1/144; H01L 23/495; H01L 23/498; H01L 23/49838; H01L 23/552; H01L 23/49811; H01L 23/5383; H01L 23/5386
USPC ................ 361/773–774, 790, 800, 816, 818; 257/659–660, 686, 737
See application file for complete search history.

(56) References Cited

U.S. PATENT DOCUMENTS

| | | | | |
|---|---|---|---|---|
| 2003/0111736 | A1* | 6/2003 | Roeters | ............... H10W 70/611 257/E25.023 |
| 2004/0002235 | A1* | 1/2004 | Shi | .......................... G06F 1/189 439/67 |
| 2004/0124516 | A1 | 7/2004 | Nakamura et al. | |
| 2006/0035258 | A1 | 2/2006 | Tadakamalla et al. | |
| 2008/0157321 | A1* | 7/2008 | Camacho | ............ H01L 23/3107 257/686 |
| 2010/0140777 | A1 | 6/2010 | Michaels et al. | |
| 2011/0317386 | A1* | 12/2011 | Kawabata | .............. H05K 3/368 361/772 |
| 2015/0170980 | A1 | 6/2015 | Kosaka et al. | |
| 2016/0057862 | A1* | 2/2016 | Kitajima | .......... H01L 23/49838 361/767 |
| 2016/0372819 | A1* | 12/2016 | Okamoto | ................. H05K 1/14 |
| 2017/0006707 | A1* | 1/2017 | Park | ................... H01L 23/5389 |
| 2017/0040304 | A1* | 2/2017 | Shih | ...................... H01L 23/552 |
| 2019/0289758 | A1 | 9/2019 | Furuya | |
| 2020/0077510 | A1 | 3/2020 | Darveaux et al. | |
| 2020/0091093 | A1 | 3/2020 | Cheah et al. | |
| 2020/0185354 | A1* | 6/2020 | Iwamoto | ................. H01L 24/85 |
| 2020/0203291 | A1* | 6/2020 | Uejima | ................... H01L 25/16 |

FOREIGN PATENT DOCUMENTS

| | | |
|---|---|---|
| JP | 2015-115558 A | 6/2015 |
| JP | 2017-092291 A | 5/2017 |
| JP | 6760397 B2 | 9/2020 |

* cited by examiner

ELECTRONIC CIRCUIT MODULE

CROSS REFERENCE TO RELATED APPLICATION

This is a continuation of International Application No. PCT/2022/006914 filed on Feb. 21, 2022 which claims priority from Japanese Patent Application No. 2021-065924 filed on Apr. 8, 2021. The contents of these applications are incorporated herein by reference in their entireties.

BACKGROUND OF THE DISCLOSURE

Field of the Disclosure

The present disclosure relates to an electronic circuit module in which an electronic component is mounted on a substrate.

Description of the Related Art

Conventionally, as this type of electronic circuit module, for example, an electronic circuit module described in Patent Document 1 is known. The electronic circuit module described in Patent Document 1 includes a substrate, a first filter element (hereinafter, referred to as a "first electronic component"), and a second filter element (hereinafter, referred to as a "second electronic component"). The second electronic component is supported on a principal surface of the substrate via a plurality of pillars. The first electronic component is disposed in a space between the substrate and the second electronic component, and is mounted on the principal surface of the substrate.

Patent Document 1: US 2020/0077510 A

BRIEF SUMMARY OF THE DISCLOSURE

In the electronic circuit module described in Patent Document 1, for example, a height of each pillar from the substrate may change due to melting of solder included in each pillar at the time of manufacturing the electronic circuit module. In this case, the position and the posture of the second electronic component may be shifted to cause malfunction of the electronic circuit module.

Therefore, a possible benefit of the present disclosure is to solve the above problem, and to provide an electronic circuit module in which displacement of a position and a posture of the second electronic component is suppressed.

In order to solve the problem, an electronic circuit module according to the present disclosure includes: a substrate; a first electronic component mounted on one principal surface of the substrate; a substrate electrode provided on the one principal surface; a second electronic component supported by a support surface opposite to a surface of the first electronic component facing the one principal surface; a component electrode provided on a surface of the second electronic component; and a conductor including a connection part connecting the substrate electrode and the component electrode, in which the second electronic component includes a conductive portion electrically connected to the component electrode, and the conductive portion is separated from a support surface of the first electronic component.

According to the present disclosure, it is possible to provide an electronic circuit module in which displacement of a position and a posture of the second electronic component is suppressed.

DETAILED DESCRIPTION OF THE DISCLOSURE

Figure 1:
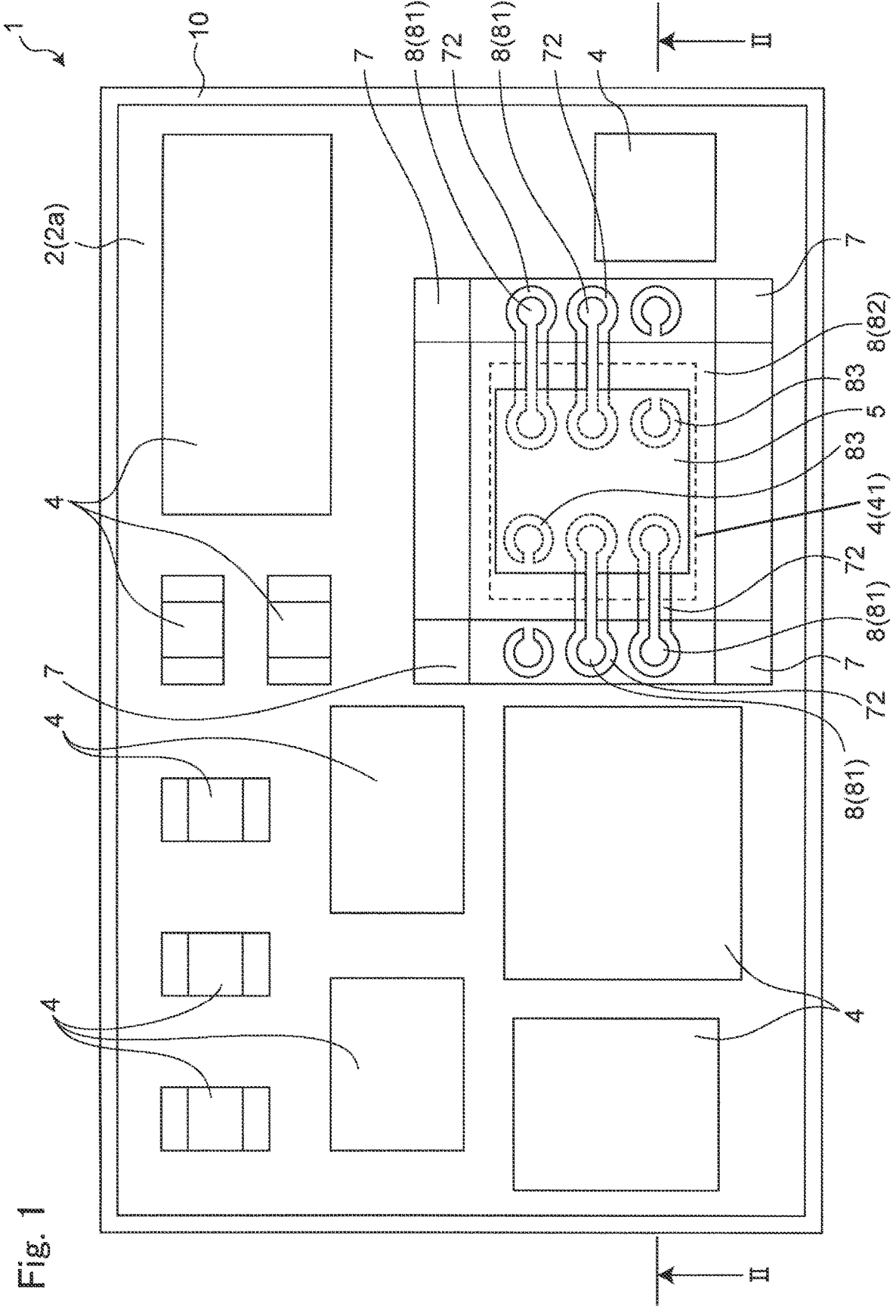
FIG. 1 is a plan view of an electronic circuit module according to a first embodiment of the present disclosure.

An electronic circuit module according to one aspect of the present disclosure includes: a substrate; a first electronic component mounted on one principal surface of the substrate; a substrate electrode provided on the one principal surface; a second electronic component supported by a support surface opposite to a surface of the first electronic component facing the one principal surface; a component electrode provided on a surface of the second electronic component; and a conductor including a connection part connecting the substrate electrode and the component electrode, in which the second electronic component includes a conductive portion electrically connected to the component electrode, and the conductive portion is separated from a support surface of the first electronic component.

According to this configuration, the second electronic component is supported by the support surface opposite to the surface of the first electronic component facing the one principal surface of the substrate. Therefore, the second electronic component can be disposed farther away from the substrate than the first electronic component in a thickness direction of the substrate, in other words, on an opposite side of the substrate with respect to the first electronic component, without being supported by a pillar provided in a conventional electronic circuit module. Therefore, it is possible to suppress displacement of the position and posture of the second electronic component.

Furthermore, according to this configuration, the conductive portion electrically connected to the component electrode is separated from the support surface of the first electronic component. As a result, it is possible to reduce the possibility that the conductive portion comes into contact with the support surface of the first electronic component and is damaged.

The second electronic component may be supported on the support surface of the first electronic component via the component electrode.

According to this configuration, a facing surface of the second electronic component facing the support surface of the first electronic component is separated from the support surface of the first electronic component. As a result, a member that needs to be disposed away from the support surface of the first electronic component, for example, a wiring pattern or the like constituting at least a part of an electronic circuit can be disposed on the facing surface of the second electronic component. Therefore, electronic components having various configurations can be used for the second electronic component.

The conductor may further include a grounding part disposed so as to cover the first electronic component and electrically connected to a ground to shield an electromagnetic wave.

According to this configuration, the grounding part shields the electromagnetic wave radiated from the outside to the first electronic component. As a result, malfunction of the first electronic component caused by the electromagnetic wave can be suppressed. Furthermore, the grounding part also shields an electromagnetic wave radiated from the first electronic component. As a result, it is possible to suppress the influence of the electromagnetic wave radiated from the first electronic component from reaching the outside.

The first electronic component may be an electronic component constituting at least a part of a transmission circuit.

With regard to an electronic component constituting at least a part of the transmission circuit, an electromagnetic wave is likely to affect the outside of the electronic component. According to this configuration, the electronic component constituting at least a part of the transmission circuit is covered by the grounding part. As a result, an electromagnetic wave radiated from the electronic component is shielded. Therefore, it is possible to suppress the influence of the electromagnetic wave radiated from the electronic component constituting at least a part of the transmission circuit from reaching the outside.

The first electronic component may be a power amplifier, a surface acoustic wave filter, or a bulk acoustic wave filter.

The second electronic component may be an electronic component constituting at least a part of a transmission circuit. The first electronic component may operate in a higher frequency band than the second electronic component.

As a frequency of a signal handled by the electronic component increases, the influence of the electromagnetic wave radiated from the electronic component easily reaches the outside. That is, among the first electronic component and the second electronic component, the electronic component operating in a higher frequency band is more likely to, due to the electromagnetic wave, affect the outside than the other electronic component.

According to this configuration, the first electronic component operating in a higher frequency band than the second electronic component is covered by the grounding part. As a result, the electromagnetic wave radiated from the first electronic component is shielded. Therefore, it is possible to secure the shielding property with respect to the first electronic component that is likely to affect the outside due to the electromagnetic wave.

The electronic circuit module according to one aspect of the present disclosure may further include a resin sheet disposed so as to cover at least a part of the first electronic component. At least a part of the conductor may be patterned on a surface of the resin sheet opposite to a surface facing the first electronic component.

According to this configuration, a part of the conductor patterned in the resin sheet does not contact a surface of the first electronic component. Therefore, a member that needs to be disposed away from the conductor, for example, a wiring pattern constituting at least a part of an electronic circuit can be disposed on the surface of the first electronic component. Therefore, electronic components having various configurations can be used for the first electronic component.

At least a part of the conductor may be in contact with a surface of the first electronic component.

According to this configuration, at least a part of the conductor is in contact with the surface of the first electronic component. Therefore, heat generated from the first electronic component is easily conducted to the conductor and dissipated. This can suppress performance degradation due to overheating of the first electronic component. Furthermore, it is possible to suppress performance degradation of the second electronic component due to thermal interference of the first electronic component with the second electronic component.

The second electronic component may be in surface contact with the support surface of the first electronic component. The component electrode may be disposed in a non-contact region not in contact with the first electronic component on the surface of the second electronic component.

According to this configuration, the second electronic component is in surface contact with the support surface of the first electronic component. Therefore, it is possible to suppress displacement of the position and posture of the second electronic component with respect to the first electronic component.

The conductor may include a grounding part disposed so as to cover the first electronic component and the second electronic component and electrically connected to a ground to shield an electromagnetic wave.

According to this configuration, the grounding part shields the electromagnetic wave radiated from the outside to the first electronic component and the second electronic component. This makes it possible to suppress malfunction of the first electronic component and the second electronic component caused by the electromagnetic wave. Furthermore, the grounding part shields electromagnetic waves radiated from the first electronic component and the second electronic component. As a result, it is possible to suppress the influence of the electromagnetic waves radiated from the first electronic component and the second electronic component from reaching the outside.

The electronic circuit module according to one aspect of the present disclosure may further include a sealing resin provided on the one principal surface and covering at least a part of the first electronic component, at least a part of the second electronic component, and a part of the conductor. At least a part of a surface of the conductor opposite to a surface facing the second electronic component, the surface being located on an opposite side to the first electronic component with respect to the second electronic component in a thickness direction of the substrate, may be exposed from the sealing resin provided on the one principal surface.

According to this configuration, the conductor and the electrode provided on another substrate (for example, a mother substrate or the like) on which the electronic circuit module is mounted can be electrically connected via a surface exposed from the sealing resin provided on the one principal surface of the substrate among the surface of the conductor.

Furthermore, according to this configuration, heat generated from the second electronic component and conducted to the conductor is easily dissipated through the surface exposed from the sealing resin provided on the one principal surface of the substrate among the surface of the conductor. This can suppress performance degradation due to overheating of the second electronic component. Furthermore, it is possible to suppress performance degradation of the first electronic component due to thermal interference of the second electronic component with the first electronic component.

The electronic circuit module according to one aspect of the present disclosure may further include a sealing resin provided on the one principal surface and covering at least a part of the first electronic component, at least a part of the second electronic component, and at least a part of the conductor. A through hole through which the conductor communicates with an outside of the sealing resin provided on the one principal surface may be formed in the sealing resin provided on the one principal surface.

In a case where the electronic circuit module is mounted on another substrate, the conductor and an electrode provided on the other substrate can be electrically connected via solder. At this time, when the solder wets and spreads, the conductor and the electrode provided on the other substrate may be short-circuited with other member. On the other hand, according to the above configuration, by disposing solder in the through hole and melting the solder, it is possible to electrically connect the conductor and the electrode provided on the other substrate while suppressing wet-spreading of the solder. Therefore, mounting failure of the electronic circuit module can be suppressed.

The electronic circuit module according to one aspect of the present disclosure may include: an electronic component mounted on another principal surface opposite to the one principal surface; a sealing resin provided on the other principal surface and covering at least a part of the electronic component mounted on the other principal surface; and a shield member covering a surface of the sealing resin provided on the other principal surface, the surface of the sealing resin being opposite to the surface in contact with the other principal surface.

According to this configuration, the electronic component can also be mounted on the other principal surface of the substrate. Therefore, the number of electronic components that can be mounted on a fixed area of the substrate increases. Therefore, the size of the substrate can be reduced.

Furthermore, according to this configuration, at least a part of the electronic component mounted on the other principal surface is covered with the shield member. This makes it possible to shield an electromagnetic wave radiated from the outside to the electronic component mounted on the other principal surface and an electromagnetic wave radiated from the electronic component. Therefore, malfunction of the electronic component mounted on the other principal surface can be suppressed. Furthermore, it is possible to suppress the influence of the electromagnetic wave radiated from the electronic component from reaching the outside.

The first electronic component and the second electronic component may be electronic components constituting at least a part of a transmission circuit.

With regard to an electronic component constituting at least a part of the transmission circuit, an electromagnetic wave is likely to affect the outside of the electronic component. According to this configuration, the electronic component constituting at least a part of the transmission circuit is covered by the grounding part. As a result, the electromagnetic wave radiated from the electronic component is shielded. Therefore, it is possible to suppress the influence of the electromagnetic wave radiated from the electronic component constituting at least a part of the transmission circuit from reaching the outside.

The second electronic component may operate in a higher frequency band than the first electronic component.

As a frequency of a signal handled by the electronic component increases, the influence of the electromagnetic wave radiated from the electronic component easily reaches the outside. That is, among the first electronic component and the second electronic component, the electronic component operating in a higher frequency band is more likely to, due to the electromagnetic wave, affect the outside than the other electronic component.

According to this configuration, the second electronic component operates in a higher frequency band than the first electronic component. The second electronic component is disposed closer to the conductor than the first electronic component in the thickness direction of the substrate. Therefore, an electromagnetic wave radiated from the second electronic component is more easily shielded by the grounding part of the conductor than an electromagnetic wave radiated from the first electronic component. Therefore, it is possible to secure the shielding property with respect to the second electronic component that is likely to affect the outside due to the electromagnetic wave.

When the substrate is viewed from a direction orthogonal to the one principal surface, an area of the second electronic component may be larger than an area of the first electronic component.

According to this configuration, a space is provided between the substrate and the second electronic component. Therefore, the electronic component mounted on one principal surface of the substrate can be accommodated in the space.

An electronic component mounted on the one principal surface may be disposed in the space.

According to this configuration, the electronic component mounted on one principal surface of the substrate is disposed in the space between the substrate and the second electronic component. This increases the number of electronic components that can be mounted on a fixed area of the one principal surface of the substrate. Therefore, the area of the one principal surface of the substrate can be reduced.

The electronic circuit module according to one aspect of the present disclosure may further include a resin sheet disposed so as to cover at least one of at least a part of the first electronic component and at least a part of the second electronic component. At least a part of the conductor may be patterned on a surface of the resin sheet opposite to a surface facing the first electronic component and the second electronic component.

According to this configuration, a part of the conductor patterned in the resin sheet does not contact a surface of the first electronic component and a surface of the second electronic component. Therefore, a member that needs to be disposed away from the conductor, such as a wiring pattern constituting at least a part of an electronic circuit, can be disposed on the surface of the first electronic component and the surface of the second electronic component. Therefore, electronic components having various configurations can be used for the first electronic component and the second electronic component.

At least a part of the conductor may be in contact with at least one of the surface of the first electronic component and the surface of the second electronic component.

According to this configuration, at least apart of the conductor is in contact with at least one of the surface of the first electronic component and the surface of the second electronic component. Therefore, heat generated from the electronic component in contact with the conductor is easily conducted to the conductor and dissipated. This can suppress performance degradation due to overheating of the electronic component in contact with the conductor. Furthermore, it is possible to suppress thermal interference of the electronic component in contact with the conductor with the electronic component disposed in the vicinity thereof. Therefore, deterioration in performance of the electronic component can be suppressed.

Hereinafter, embodiments of the present disclosure will be described with reference to the drawings. Note that these embodiments do not limit the present disclosure. Furthermore, in the drawings, substantially the same members are denoted by the same reference signs, and the description thereof will be omitted.

Hereinafter, for convenience of description, terms indicating directions such as "upper layer", "middle layer", "lower layer", "top surface", and "side surface" are used, but these terms do not limit a use state or the like of the electronic circuit module according to the present disclosure.

In the present specification and claims, "electrically connected" includes any of the following: current can conduct between two or more elements, two or more elements are capacitively coupled, and two or more elements are electromagnetically coupled.

First Embodiment

Figure 2:
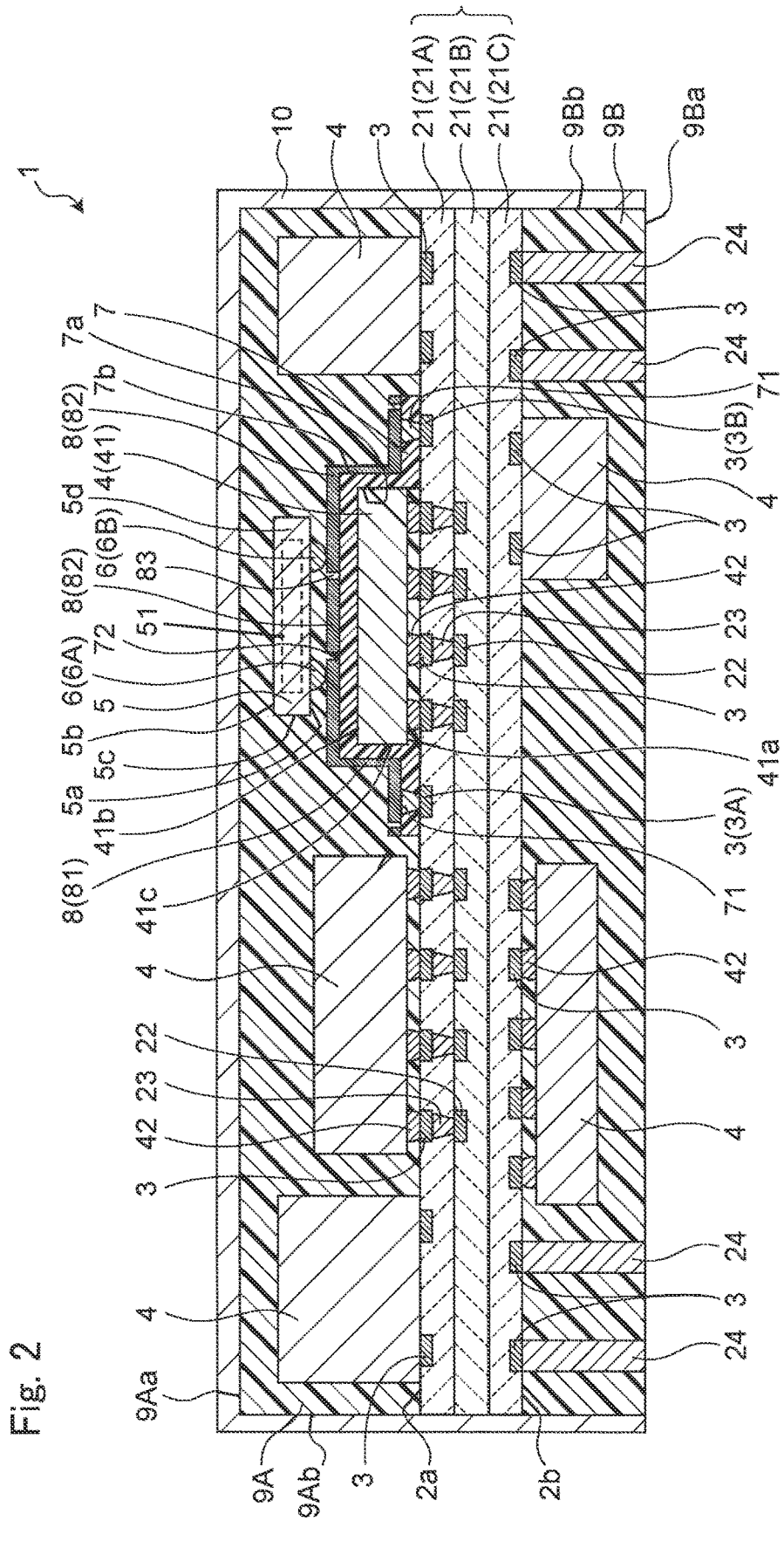
FIG. 2 is a cross-sectional view of the electronic circuit module of FIG. 1 taken along line II-II.

FIG. 1 is a plan view of an electronic circuit module according to a first embodiment of the present disclosure. FIG. 2 is a cross-sectional view of the electronic circuit module of FIG. 1 taken along line II-II. Note that, in FIG. 1, a sealing resin 9A and a part of a shield member 10, which will be described later, which is in contact with a top surface 9Aa of the sealing resin 9A are omitted.

In the first embodiment, as illustrated in FIGS. 1 and 2, an electronic circuit module 1 includes a substrate 2, a land electrode 3, an electronic component 4 including a first electronic component 41, a second electronic component 5, a terminal 6, a resin sheet 7, a conductor 8, the sealing resin 9A, a sealing resin 9B, the shield member 10, and a columnar electrode 24.

The substrate 2 is a double-sided mounting substrate, and includes a plurality of insulating layers 21 as illustrated in FIG. 2. In the present embodiment, the plurality of insulating layers 21 includes an upper layer 21A, a middle layer 21B, and a lower layer 21C. The middle layer 21B is laminated on the lower layer 21C. The upper layer 21A is laminated on a surface of the middle layer 21B opposite to a surface in contact with the lower layer 21C. A surface of the upper layer 21A opposite to the surface in contact with the middle layer 21B constitutes one principal surface 2a of the substrate 2. A surface of the lower layer 21C opposite to the surface in contact with the middle layer 21B constitutes the other principal surface 2b of the substrate 2.

Each of the insulating layers 21 is made of, for example, ceramic such as alumina, or resin such as glass epoxy, Teflon (registered trademark), or paper phenol.

A plurality of the land electrodes 3 are formed on one principal surface 2a and the other principal surface 2b of the substrate 2. The plurality of land electrodes 3 include a connection electrode 3A and a ground electrode 3B. The connection electrode 3A and the ground electrode 3B are formed on one principal surface 2a of the substrate 2. The connection electrode 3A is an example of a substrate electrode in the present disclosure.

In the present embodiment, four connection electrodes 3A and two ground electrodes 3B are provided. FIG. 2 illustrates one connection electrode 3A and one ground electrode 3B among the connection electrodes 3A and the ground electrodes 3B. Each connection electrode 3A and each ground electrode 3B are disposed away from the first electronic component 41 to be described later when the substrate 2 is viewed from a direction orthogonal to the one principal surface 2a.

Each connection electrode 3A is electrically connected to an electronic circuit provided on the substrate 2. Each ground electrode 3B is grounded by being electrically connected to an external ground potential. The external ground potential is provided to, for example, a ground electrode provided on another substrate (for example, a mother substrate) on which the electronic circuit module 1 is mounted. Note that each connection electrode 3A may be grounded by being connected to the external ground potential.

In a case where the plurality of insulating layers 21 are made of ceramic, the land electrodes 3 are obtained by co-firing a conductive paste printed on the one principal surface 2a and the other principal surface 2b of the substrate 2 with the plurality of insulating layers 21. In this case, the land electrodes 3 are made of, for example, copper. In a case where the plurality of insulating layers 21 are made of resin, the land electrodes 3 are formed on the one principal surface 2a and the other principal surface 2b of the substrate 2 by a known means such as etching. In this case, the land electrodes 3 are made of, for example, a metal foil.

Internal conductors 22 are formed on a surface of the middle layer 21B in contact with the upper layer 21A. The internal conductors 22 are formed, for example, in the same manner as the land electrodes 3. Note that the internal conductors 22 may not be provided on the substrate 2.

Each of the insulating layers 21 is provided with via conductors 23 penetrating each layer. In a case where the plurality of insulating layers 21 are made of ceramic, the via conductors 23 are formed by co-firing a conductive paste filled in holes formed in the respective insulating layers 21 with the plurality of insulating layers 21. In this case, the via conductors 23 are made of, for example, copper. In a case where the plurality of insulating layers 21 is made of resin, the via conductors 23 are conductive members disposed on inner surfaces of holes formed in the respective insulating layers 21. In this case, the via conductors 23 are made of, for example, a metal foil. Note that the via conductors 23 may not be provided in each of the insulating layers 21.

A plurality of the electronic components 4 are mounted on the one principal surface 2a and the other principal surface 2b of the substrate 2. The plurality of electronic components 4 include one first electronic component 41.

Each of the electronic components 4 is electrically connected to the land electrodes 3. For example, some of the plurality of electronic components 4 are connected to the land electrodes 3 via solder bumps 42 made of solder. Furthermore, for example, some of the plurality of electronic components 4 are in direct contact with and electrically connected to the land electrodes 3. Note that a connection means between the electronic components 4 and the land electrodes 3 is not limited to the above example, and various known connection means can be adopted.

The first electronic component 41 is mounted on the one principal surface 2a of the substrate 2. The first electronic component 41 includes a first surface 41a facing the one principal surface 2a of the substrate 2, a second surface 41b opposite to the first surface 41a, and a third surface 41c connecting an edge of the first surface 41a and an edge of the second surface 41b. The second surface 41b is an example of a support surface in the present disclosure.

As the first electronic component 41, for example, various electronic components such as a resistor, an inductor, a capacitor, and an integrated circuit are used. In the present embodiment, the first electronic component 41 is an electronic component constituting at least a part of a transmission circuit. Examples of the electronic component include a power amplifier, a surface acoustic wave filter, and a bulk acoustic wave filter.

The first electronic component 41 is covered with the resin sheet 7. The resin sheet 7 is disposed across the second surface 41b and the third surface 41c of the first electronic component 41, the connection electrode 3A, and the ground electrode 3B. The resin sheet 7 is made of, for example, polyimide and liquid crystal polymer.

The resin sheet 7 includes an inner surface 7a facing the first electronic component 41 and an outer surface 7b opposite to the inner surface 7a. Here, each of the inner surface 7a and the outer surface 7b refers to the entire surface of one of the front and back surfaces of the resin sheet 7. That is, the inner surface 7a includes not only a region of a surface of the resin sheet 7 facing the first electronic component 41 but also a region of the resin sheet 7 facing the one principal surface 2a of the substrate 2.

In the resin sheet 7, via conductors 71 are provided in portions overlapping the connection electrodes 3A and the ground electrodes 3B when the substrate 2 is viewed from a direction orthogonal to the one principal surface 2a. In the present embodiment, six via conductors 71 corresponding to the four connection electrodes 3A and the two ground electrodes 3B are provided. FIG. 2 illustrates two of the six via conductors 71.

Each of the via conductors 71 is connected to each of the connection electrodes 3A or each of the ground electrodes 3B at one end portion, and is connected to a connection part 81 or a grounding part 82 of the conductor 8 described later at the other end portion. The via conductors 71 are formed, for example, by filling holes formed in the resin sheet 7 with a conductive paste and curing the conductive paste.

The conductor 8 is patterned on the outer surface 7b of the resin sheet 7. The conductor 8 is made of, for example, copper, silver, aluminum, stainless steel, nickel, gold, an alloy thereof, or the like. In the present embodiment, the conductor 8 is a copper foil. Patterning of the conductor 8 is performed by known means such as photolithography and etching.

The conductor 8 includes a connection part 81 and a grounding part 82.

The connection part 81 connects the via conductor 71 connected to the connection electrode 3A and a connection terminal 6A (described later) formed on the second electronic component 5. In the present embodiment, as illustrated in FIG. 1, four connection parts 81 connected to four connection electrodes 3A (see FIG. 2) are provided. Each of the connection parts 81 has a shape in which two circular portions overlapping the connection electrode 3A and the connection terminal 6A and a linear portion connecting the two circular portions are integrated when the substrate 2 is viewed from a direction orthogonal to the one principal surface 2a. Note that the shape of each of the connection parts 81 is not limited to the above-described shape, and may be, for example, a polygonal shape when the substrate 2 is viewed from a direction orthogonal to the one principal surface 2a.

As illustrated in FIG. 2, the grounding part 82 connects the via conductor 71 connected to the ground electrode 3B and a ground terminal 6B (described later) formed in the second electronic component 5. In the present embodiment, as illustrated in FIG. 1, one grounding part 82 connected to two ground electrodes 3B and two ground terminals 6B (see FIG. 2) is provided. Since the ground electrode 3B is connected to the ground potential, the grounding part 82 is grounded.

As illustrated in FIGS. 1 and 2, the grounding part 82 is disposed so as to cover the first electronic component 41. In the present embodiment, as illustrated in FIG. 1, the grounding part 82 covers a part of the outer surface 7b of the resin sheet 7 excluding a part where the connection part 81 is patterned and a peripheral portion 72 of the connection part 81. That is, the grounding part 82 is disposed away from each connection part 81. In the present embodiment, an area of a part of the grounding part 82 facing the first electronic component 41 is larger than each of an area of a part of the connection part 81 facing the first electronic component 41 and an area of a part of the peripheral portion 72 facing the first electronic component 41.

Since the grounding part 82 is grounded, an electromagnetic wave radiated from the outside to the first electronic component 41 and an electromagnetic wave radiated from the first electronic component 41 can be shielded. Moreover, the grounding part 82 also functions as a wiring that electrically connects the ground terminal 6B to the ground electrode 3B to be grounded.

In the grounding part 82, a C-shaped groove 83 surrounding a part overlapping each ground terminal 6B is formed when the substrate 2 is viewed from a direction orthogonal to the one principal surface 2a. In the present embodiment, as illustrated in FIG. 2, the groove 83 penetrates the grounding part 82. Note that the groove 83 may have a shape other than the C-shape when the substrate 2 is viewed from the direction orthogonal to the one principal surface 2a. Furthermore, the groove 83 may not be formed in the grounding part 82.

As illustrated in FIG. 2, the second electronic component 5 is disposed on the second surface 41b of the first electronic component 41 via the resin sheet 7 and the conductor 8. That is, the second electronic component 5 is supported by the second surface 41b of the first electronic component 41 via the resin sheet 7 and the conductor 8. The second electronic component 5 includes a first surface 5a facing the second surface 41b of the first electronic component 41 across the resin sheet 7 and the conductor 8, a second surface 5b opposite to the first surface 5a, and a third surface 5c connecting an edge of the first surface 5a and an edge of the second surface 5b. In the present embodiment, one second electronic component 5 is provided.

As the second electronic component 5, for example, various electronic components such as a resistor, an inductor, a capacitor, and an integrated circuit are used. In the present embodiment, the second electronic component 5 is an electronic component constituting at least a part of a reception circuit. Examples of the electronic component include a low noise amplifier, a surface acoustic wave filter, and a bulk acoustic wave filter.

In the present embodiment, as illustrated in FIG. 1, the second electronic component 5 overlaps the grounding part 82 when the substrate 2 is viewed from a direction orthogonal to the one principal surface 2a. The part of the grounding part 82 overlapping with the second electronic component 5 shields electromagnetic waves radiated by the first electronic component 41 and the second electronic component 5 with respect to each other. Therefore, the second electronic component 5 can be disposed close to the first electronic component 41 in the thickness direction of the substrate 2. Therefore, the height of the electronic circuit module 1 can be reduced.

As illustrated in FIG. 2, a plurality of terminals 6 are provided on the first surface 5a of the second electronic component 5. The plurality of terminals 6 include a connection terminal 6A and a ground terminal 6B. The connection terminal 6A is an example of a component electrode in the present disclosure.

The connection terminal 6A is connected to the connection part 81 of the conductor 8. That is, the connection terminal 6A is electrically connected to the connection electrode 3A via the connection part 81. As a result, power supply and signal transmission are performed between the second electronic component 5 and the substrate 2 via the connection part 81. Furthermore, in a case where the connection electrode 3A is electrically connected to the ground potential, the connection terminal 6A is grounded via the connection part 81.

The ground terminal 6B is connected to the grounding part 82 of the conductor 8. Since the grounding part 82 is connected to the ground electrode 3B, the ground terminal 6B is grounded.

The second electronic component 5 is connected to the conductor 8 via the terminal 6. In the present embodiment, the terminal 6 is a solder bump electrically connected to the second electronic component 5. The groove 83 described above can prevent the solder constituting the terminal 6 from wetting and spreading in the manufacturing process of the electronic circuit module 1. Therefore, malfunction of the electronic circuit module 1 due to solder wetting and spreading can be suppressed.

In the present embodiment, a part of the conductor 8 overlapping with the terminal 6 when the substrate 2 is viewed from a direction orthogonal to the one principal surface 2a is a copper foil patterned on the resin sheet 7. Therefore, a part of the conductor 8 sandwiched between the second electronic component 5 and the first electronic component 41 is thin in the thickness direction of the substrate 2. As a result, the height from the one principal surface 2a of the substrate 2 to the second surface 5b of the second electronic component 5 can be reduced. Therefore, the height of the electronic circuit module 1 can be reduced.

The second electronic component 5 includes a conductive portion 51 electrically connected to the connection terminal 6A. In a case where the second electronic component 5 includes a circuit, the conductive portion 51 may constitute at least a part of the circuit. The conductive portion 51 is, for example, a wiring, a coupling line, an electrode, or the like. The conductive portion 51 may form at least a part of the element.

In the example illustrated in FIG. 2, the conductive portion 51 is disposed in an interior 5d of the second electronic component 5. That is, the conductive portion 51 is separated from the second surface 41b of the first electronic component 41. That is, the conductive portion 51 is not in contact with the second surface 41b of the first electronic component 41. In other words, in the second electronic component 5, the conductive portion 51 is disposed in a non-contact portion that is not in contact with the second surface 41b of the first electronic component 41.

In the present embodiment, the second electronic component 5 is not in contact with the second surface 41b of the first electronic component 41. Therefore, as long as the conductive portion 51 is not in contact with the second surface 41b of the first electronic component 41, for example, the conductive portion 51 may be disposed on the first surface 5a, the second surface 5b, and the third surface 5c of the second electronic component 5.

As illustrated in FIG. 1, when the substrate 2 is viewed from a direction orthogonal to the one principal surface 2a, an area of the second electronic component 5 is smaller than an area of the first electronic component 41. Note that, as long as the first electronic component 41 can support the second electronic component 5, the area of the second electronic component 5 may be larger than or equal to the area of the first electronic component 41 when the substrate 2 is viewed from the direction orthogonal to the one principal surface 2a.

As illustrated in FIG. 2, the sealing resin 9A is provided on the one principal surface 2a of the substrate 2. The sealing resin 9A covers the electronic component 4, the second electronic component 5, the resin sheet 7, and the conductor 8. The sealing resin 9A includes a top surface 9Aa opposite to a contact surface with the one principal surface 2a of the substrate 2, and a side surface 9Ab connecting an edge of the contact surface and an edge of the top surface 9Aa.

The sealing resin 9A is made of, for example, an epoxy resin or the like. Furthermore, the sealing resin 9A may contain a filler such as silica filler and alumina.

The other principal surface 2b of the substrate 2 is provided with the plurality of land electrodes 3, the plurality of electronic components 4, a plurality of the columnar electrodes 24, and the sealing resin 9B.

The land electrode 3 provided on the other principal surface 2b of the substrate 2 is configured similarly to the land electrode 3 provided on the one principal surface 2a of the substrate 2. Note that the land electrode 3 provided on the other principal surface 2b of the substrate 2 may have a configuration different from that of the land electrode 3 provided on the one principal surface 2a of the substrate 2.

One end portion of each of the columnar electrodes 24 is connected to the land electrode 3 formed on the other principal surface 2b of the substrate 2.

The sealing resin 9B covers the electronic component 4 and a part of the columnar electrode 24. The sealing resin 9B includes a top surface 9Ba opposite to a contact surface with respect to the other principal surface 2b of the substrate 2, and a side surface 9Bb connecting an edge of the contact surface and an edge of the top surface 9Ba. Note that the sealing resin 9B may cover only a part of the electronic component 4.

An end portion of each of the columnar electrodes 24 opposite to the end portion connected to the land electrode 3 is exposed to the top surface 9Ba of the sealing resin 9B. The exposed end of the columnar electrode 24 is connected to an electrode provided on another substrate on which the electronic circuit module 1 is mounted.

The shield member 10 is disposed across the top surface 9Aa and the side surface 9Ab of the sealing resin 9A and the side surface 9Bb of the sealing resin 9B. The shield member 10 includes a conductive material and is grounded by being electrically connected to an external ground potential. As a result, the shield member 10 shields the electromagnetic wave. The shield member 10 is formed by, for example, a sputtering method or a vapor deposition method. In the present embodiment, the shield member 10 is separated from the second surface 5*b* of the second electronic component 5.

According to the first embodiment, the second electronic component 5 is supported by the second surface 41*b* of the first electronic component 41. Therefore, the second electronic component 5 can be disposed farther away from the substrate 2 than the first electronic component 41 in the thickness direction of the substrate 2, in other words, on the opposite side of the substrate 2 with respect to the first electronic component 41, without being supported by a pillar provided in a conventional electronic circuit module. Therefore, it is possible to suppress displacement of the position and posture of the second electronic component 5.

According to the first embodiment, the conductive portion 51 electrically connected to the component electrode is separated from the second surface 41*b* of the first electronic component 41. This can reduce the possibility that the conductive portion 51 comes into contact with the second surface 41*b* of the first electronic component 41 and is damaged.

According to the first embodiment, the first surface 5*a* of the second electronic component 5 is separated from the second surface 41*b* of the first electronic component 41. As a result, a member that needs to be disposed away from the second surface 41*b* of the first electronic component 41, for example, a wiring pattern or the like constituting at least a part of the electronic circuit can be disposed on the first surface 5*a* of the second electronic component 5. Therefore, electronic components having various configurations can be used for the second electronic component 5.

According to the first embodiment, the grounding part 82 shields the electromagnetic wave radiated from the outside to the first electronic component 41. This makes it possible to suppress malfunction of the first electronic component 41 caused by the electromagnetic wave. Furthermore, the grounding part 82 also shields the electromagnetic wave radiated from the first electronic component 41. As a result, it is possible to suppress the influence of the electromagnetic wave radiated from the first electronic component 41 from reaching the outside.

With regard to an electronic component constituting at least a part of the transmission circuit, an electromagnetic wave is likely to affect the outside of the electronic component. According to the first embodiment, the first electronic component 41 constituting at least a part of the transmission circuit is covered by the grounding part 82. As a result, the electromagnetic wave radiated from the first electronic component 41 is shielded. Therefore, it is possible to suppress the influence of the electromagnetic wave radiated from the first electronic component 41 constituting at least a part of the transmission circuit from reaching the outside.

According to the first embodiment, the part of the conductor 8 patterned in the resin sheet 7 does not contact the surface of the first electronic component 41. Therefore, a member that needs to be disposed away from the conductor, for example, a wiring pattern or the like constituting at least a part of the electronic circuit can be disposed on the surface of the first electronic component 41. Therefore, electronic components having various configurations can be used for the first electronic component 41.

Modification of First Embodiment

Figure 3:
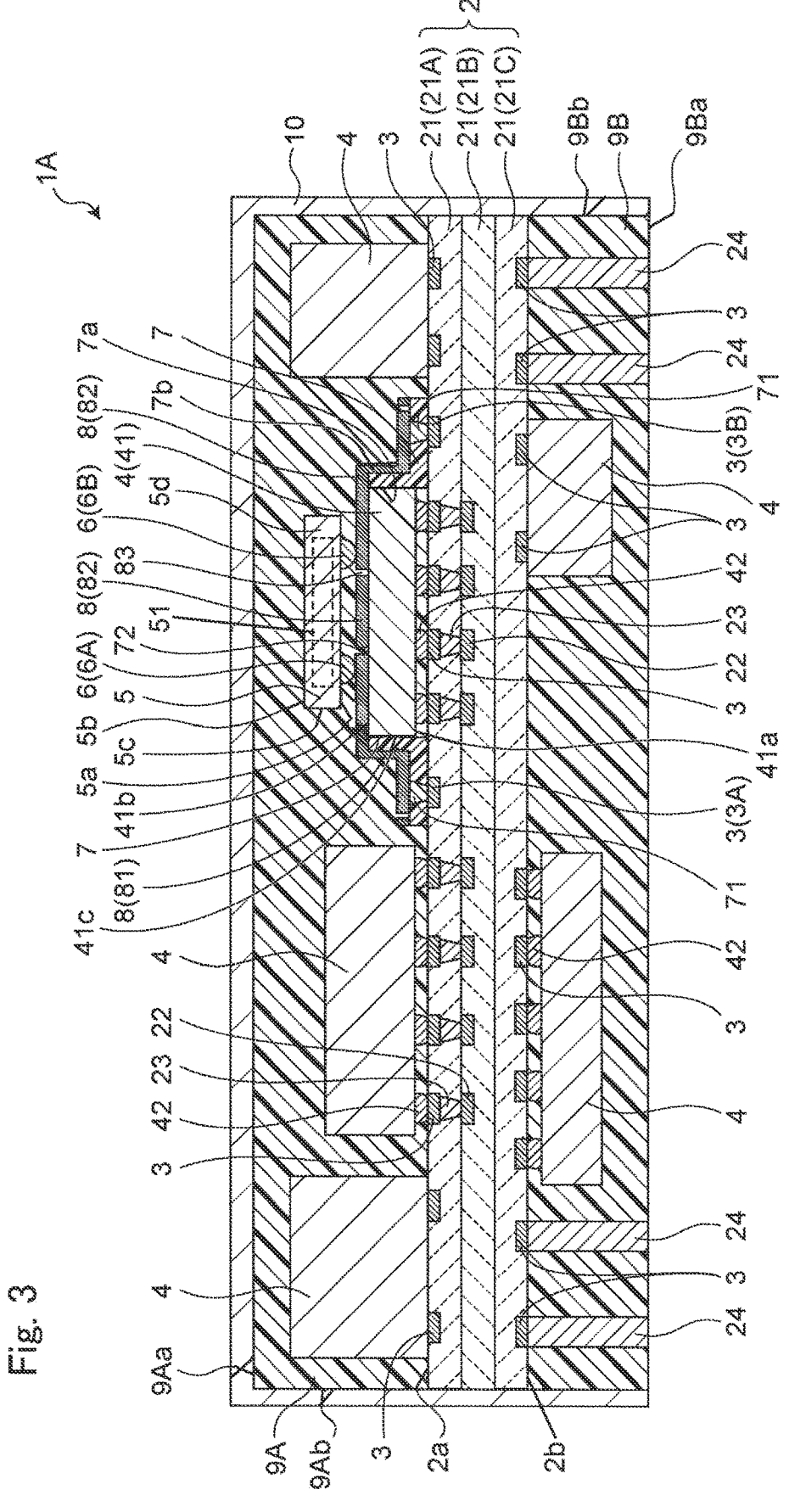
FIG. 3 is a cross-sectional view illustrating a cross section at a position corresponding to line II-II in FIG. 1 of a modification of the electronic circuit module according to the first embodiment of the present disclosure.

FIG. 3 is a cross-sectional view illustrating a cross section of a modification of the electronic circuit module according to the first embodiment of the present disclosure at a position corresponding to line II-II in FIG. 1. In an electronic circuit module 1A illustrated in FIG. 3, the resin sheet 7 is disposed across the third surface 41*c* of the first electronic component 41, the connection electrode 3A, and the ground electrode 3B. On the other hand, the resin sheet 7 is not disposed on the second surface 41*b* of the first electronic component 41. Therefore, the conductor 8 is in contact with the second surface 41*b* of the first electronic component 41.

The resin sheet 7 and the conductor 8 in the electronic circuit module 1A are formed, for example, as follows. First, before the resin sheet 7 is disposed in the electronic circuit module 1A, the conductor 8 is patterned on the resin sheet 7. Next, a part of the resin sheet 7 on which the conductor 8 is patterned is removed by, for example, etching or the like. The part is a part where the conductor 8 comes into contact with the second surface 41*b* of the first electronic component 41 when the resin sheet 7 is disposed in the electronic circuit module 1A. At this time, the conductor 8 patterned in the part remains without being removed. Next, the resin sheet 7 and the conductor 8 are molded into a shape that covers the first electronic component 41. The molded resin sheet 7 and conductor 8 are disposed on the electronic circuit module 1A so as to cover the first electronic component 41. As a result, the conductor 8 patterned in the part comes into contact with the second surface 41*b* of the first electronic component 41. On the other hand, the resin sheet 7 is interposed between the conductor 8 patterned in a region other than the part of the resin sheet 7 and the first electronic component 41.

According to the modification of the first embodiment, at least a part of the conductor 8 is in contact with the surface of the first electronic component 41. Therefore, heat generated from the first electronic component 41 is easily conducted to the conductor 8 and dissipated. This can suppress performance degradation due to overheating of the first electronic component 41. Furthermore, it is possible to suppress performance degradation of the second electronic component 5 due to thermal interference of the first electronic component 41 with the second electronic component 5.

Note that the present disclosure is not limited to the above-described embodiment, and can be implemented in various other modes. In the first embodiment and each embodiment described later, the electronic component 4 is mounted on the one principal surface 2*a* and the other principal surface 2*b* of the substrate 2, but the present disclosure is not limited thereto. For example, the electronic component 4 may be mounted only on the one principal surface 2*a* of the substrate 2.

In the first embodiment and each embodiment described later, the number of the insulating layers 21 is not limited to three, and may be one or more.

In the first embodiment and each embodiment described later, the number of the connection electrodes 3A is not limited to four, and may be one or more. The number of ground electrodes 3B is not limited to two, and may be one or three or more. Furthermore, the ground electrode 3B may not be provided on the substrate 2.

In the first embodiment, each connection electrode 3A and each ground electrode 3B are disposed away from the first electronic component 41 when the substrate 2 is viewed from the direction orthogonal to the one principal surface 2a, but the present disclosure is not limited thereto. For example, each connection electrode 3A and each ground electrode 3B may be disposed at a position overlapping the first electronic component 41 when the substrate 2 is viewed from a direction orthogonal to the one principal surface 2a.

In the first embodiment and each embodiment described later, the number of grounding parts 82 is not limited to one, and may be two or more. Furthermore, the conductor 8 may not include the grounding part 82.

In the first embodiment, the first electronic component 41 is an electronic component constituting at least a part of a transmission circuit, and the second electronic component 5 is an electronic component constituting at least a part of a reception circuit, but the present disclosure is not limited thereto. For example, both the first electronic component 41 and the second electronic component 5 may be electronic components constituting at least a part of the transmission circuit. In this case, the first electronic component 41 may operate in a higher frequency band than the second electronic component 5.

As a frequency of a signal handled by the electronic component increases, the influence of the electromagnetic wave radiated from the electronic component easily reaches the outside. That is, in a case where the first electronic component 41 operates in a higher frequency band than the second electronic component 5, the first electronic component 41 more easily affects the outside than the second electronic component 5 due to the electromagnetic wave. On the other hand, the first electronic component 41 is covered with the grounding part 82. As a result, the electromagnetic wave radiated from the first electronic component 41 is shielded by the grounding part 82. Therefore, it is possible to secure the shielding property with respect to the first electronic component 41 that is likely to affect the outside due to the electromagnetic wave.

In the first embodiment and each embodiment described later, the grounding part 82 is grounded by being electrically connected to the ground electrode 3B and the ground terminal 6B, but the present disclosure is not limited thereto. The grounding part 82 may be grounded by being electrically connected to the ground potential. For example, the grounding part 82 may be grounded by being connected to the shield member 10, and may not be connected to the ground electrode 3B and the ground terminal 6B.

In the first embodiment, each connection electrode 3A and each ground electrode 3B are disposed outside the first electronic component 41 when the substrate 2 is viewed from the direction orthogonal to the one principal surface 2a, but the present disclosure is not limited thereto. For example, each connection electrode 3A and each ground electrode 3B may be disposed inside the first electronic component 41 when the substrate 2 is viewed from the direction orthogonal to the one principal surface 2a.

In the first embodiment and each embodiment described later, the resin sheet 7 may not be provided in the electronic circuit module 1, and 1A to 1E. In this case, the conductor 8 may be, for example, a metal plate, a metal film, or the like.

In the first embodiment and each embodiment described later, the number of the connection terminals 6A is not limited to four, and may be one or more. The number of ground terminals 6B is not limited to two, and may be one or three or more. Furthermore, the ground terminal 6B may not be provided in the second electronic component 5.

Figure 4:
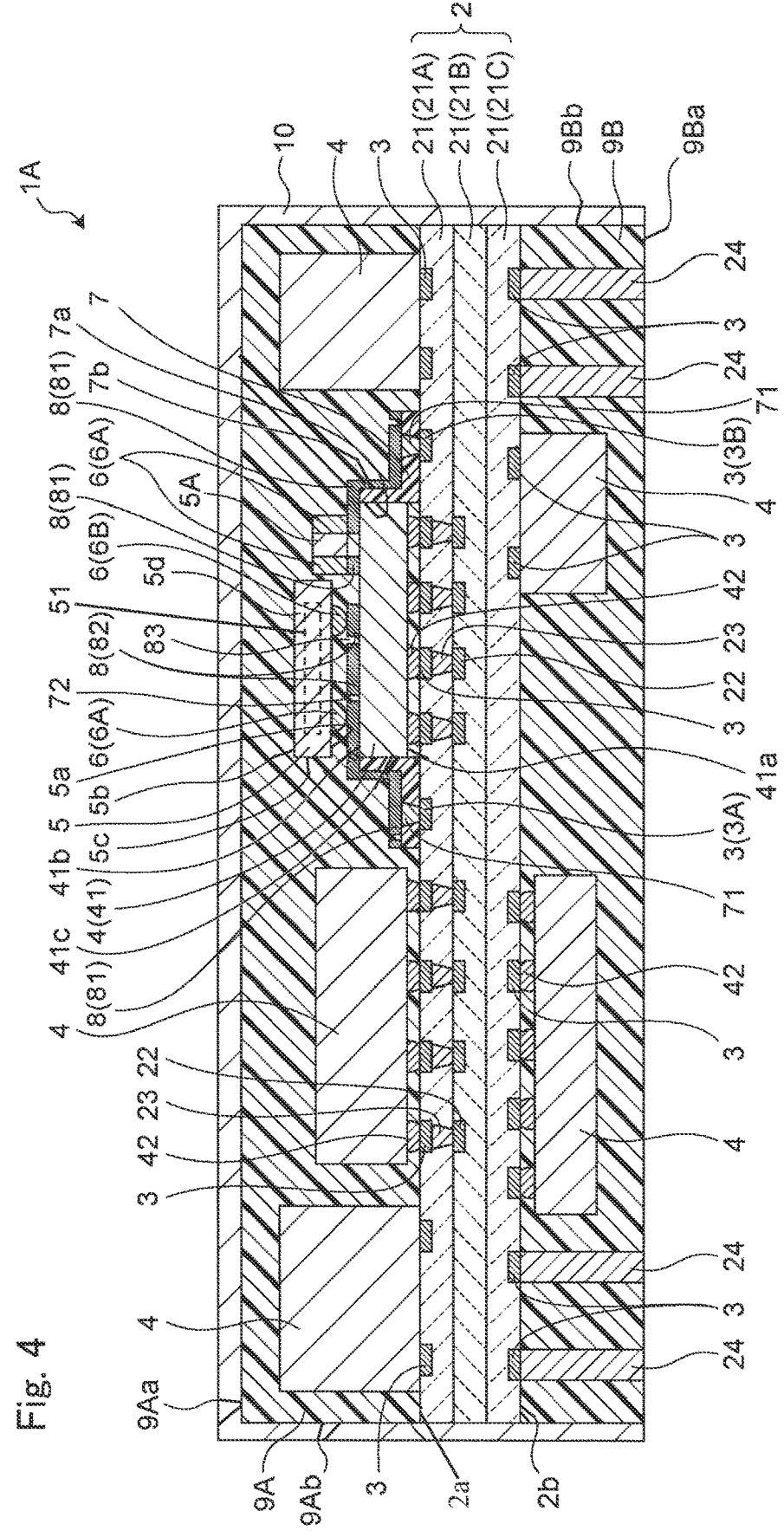
FIG. 4 is a cross-sectional view illustrating a cross section at a position corresponding to line II-II in FIG. 1 of a modification of the electronic circuit module according to the first embodiment of the present disclosure.

In the first embodiment, one second electronic component 5 is provided, but the present disclosure is not limited thereto. FIG. 4 is a cross-sectional view illustrating a cross section of a modification of the electronic circuit module according to the first embodiment of the present disclosure at a position corresponding to line II-II in FIG. 1. The electronic circuit module 1A illustrated in FIG. 4 is provided with two second electronic components 5 including a second electronic component 5A. The second electronic component 5A has connection terminals 6A at both ends in a direction parallel to the one principal surface 2a of the substrate 2 (horizontal direction in FIG. 4). Each connection terminal 6A is connected to the connection part 81 of the conductor 8. The second electronic component 5A is, for example, an electronic component constituting at least a part of an impedance matching circuit. Examples of the electronic component include an inductor and a capacitor.

In the first embodiment, the sealing resin 9A covers the electronic component 4, the second electronic component 5, the resin sheet 7, and the conductor 8, but the present disclosure is not limited thereto. For example, the sealing resin 9A may cover only some of the electronic component 4, the second electronic component 5, the resin sheet 7, and the conductor 8. Furthermore, for example, the sealing resin 9A may cover only a part of the surface of each member.

In the first embodiment, the shield member 10 is disposed across the top surface 9Aa and the side surface 9Ab of the sealing resin 9A and the side surface 9Bb of the sealing resin 9B, but the present disclosure is not limited thereto. For example, the shield member 10 may be arranged in a region of the top surface 9Ba of the sealing resin 9B excluding a part where the columnar electrode 24 is exposed. Furthermore, the shield member 10 may not be provided in the electronic circuit module 1.

Figure 5:
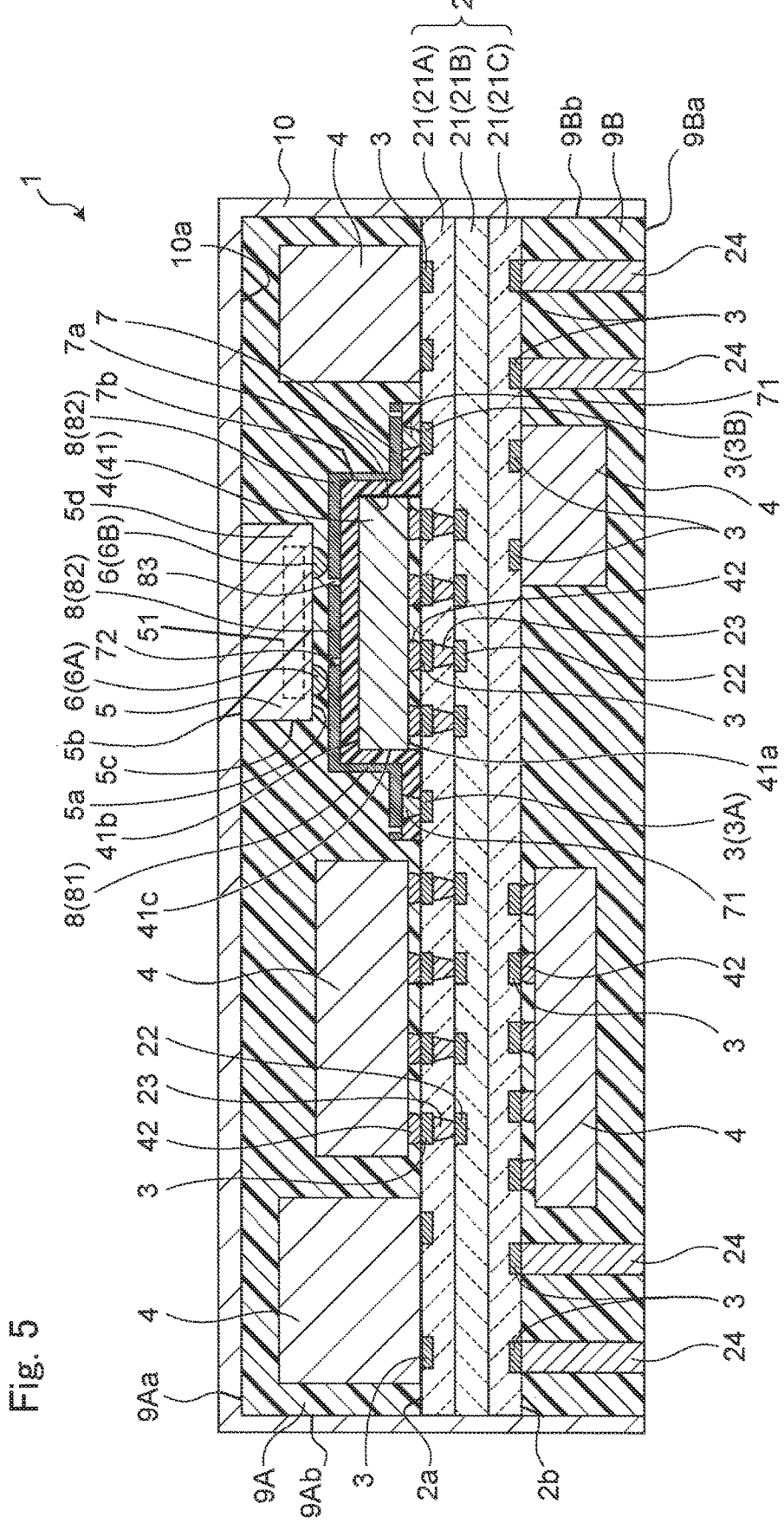
FIG. 5 is a cross-sectional view illustrating a cross section at a position corresponding to line II-II in FIG. 1 of a modification of the electronic circuit module according to the first embodiment of the present disclosure.

In the first embodiment, the shield member 10 is separated from the second surface 5b of the second electronic component 5, but the present disclosure is not limited thereto. FIG. 5 is a cross-sectional view illustrating a cross section of a modification of the electronic circuit module according to the first embodiment of the present disclosure at a position corresponding to line II-II in FIG. 1. For example, among the surfaces of the shield member 10, the inner surface 10a facing the one principal surface 2a of the substrate 2 may be in contact with the second surface 5b of the second electronic component 5 as illustrated in FIG. 5. Furthermore, in a case where an electrode is formed on the second surface 5b of the second electronic component 5, the electrode may be electrically connected to the shield member 10 and grounded.

In the modification of the first embodiment, the conductor 8 is in contact with the second surface 41b of the first electronic component 41, but the present disclosure is not limited thereto. For example, the conductor 8 may be in contact with at least one of the first surface 41a and the third surface 41c of the first electronic component 41.

Second Embodiment

Figure 6:
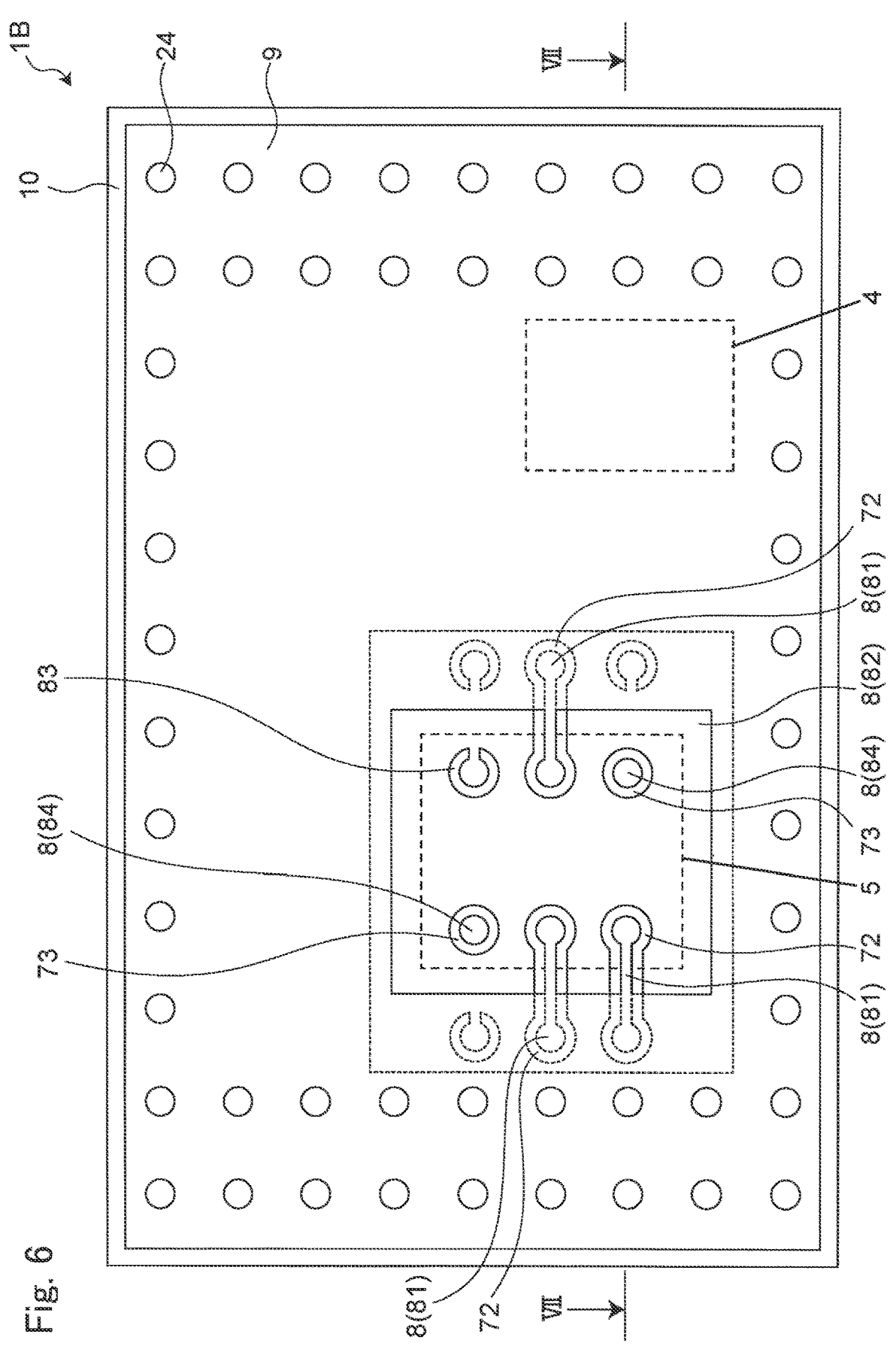
FIG. 6 is a bottom view of an electronic circuit module according to a second embodiment of the present disclosure.
Figure 7:
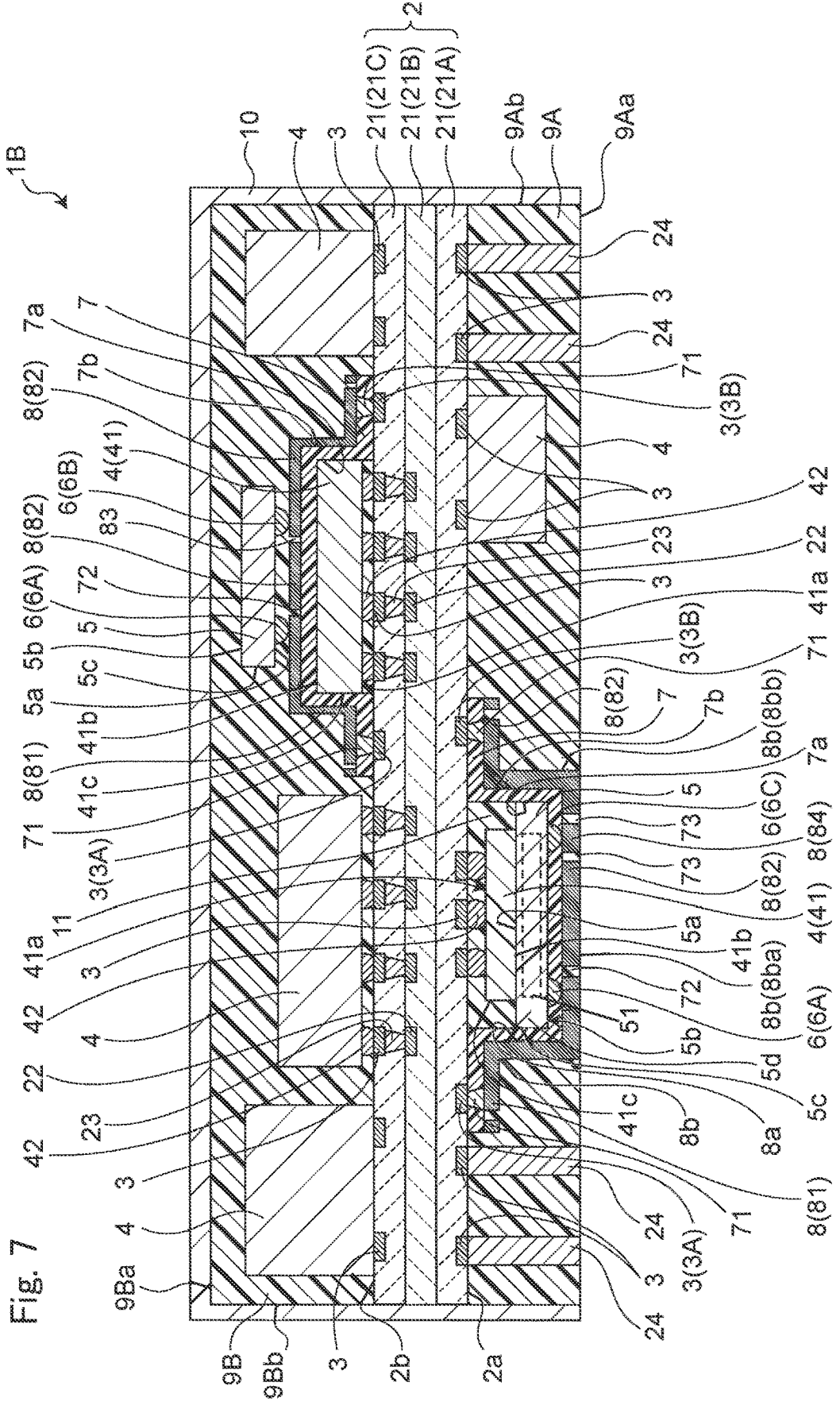
FIG. 7 is a cross-sectional view of the electronic circuit module of FIG. 6 taken along line VII-VII.

FIG. 6 is a bottom view of an electronic circuit module according to a second embodiment of the present disclosure. FIG. 7 is a cross-sectional view of the electronic circuit module of FIG. 6 taken along line VII-VII;

An electronic circuit module 1B according to the second embodiment is different from the electronic circuit module 1 according to the first embodiment in that the second electronic component 5 is in surface contact with the second surface 41*b* of the first electronic component 41. Furthermore, the plurality of terminals 6 are provided on the second surface 5*b* of the second electronic component 5. Furthermore, the grounding part 82 is disposed so as to cover the first electronic component 41 and the second electronic component 5.

Note that the configuration on a side of the other principal surface 2*b* in the second embodiment is the same as the configuration on a side of the one principal surface 2*a* in the first embodiment. Therefore, in the second embodiment, the description of the configuration on the side of the other principal surface 2*b* is omitted. Furthermore, in a case where the number of components is described in the description of the second embodiment, the number of only the components provided on the side of the one principal surface 2*a* is indicated, and the number of the components provided on the side of the other principal surface 2*b* is not included.

As illustrated in FIG. 7, the substrate 2 includes a plurality of insulating layers 21 including an upper layer 21A, a middle layer 21B, and a lower layer 21C. A plurality of the land electrodes 3 are formed on one principal surface 2*a* and the other principal surface 2*b* of the substrate 2. In the present embodiment, the plurality of land electrodes 3 include three connection electrodes 3A and three ground electrodes 3B formed on the one principal surface 2*a* of the substrate 2. FIG. 7 illustrates one connection electrode 3A and one ground electrode 3B among the connection electrodes 3A and the ground electrodes 3B.

Each connection electrode 3A and each ground electrode 3B are disposed outside the second electronic component 5 when the substrate 2 is viewed from the direction orthogonal to the one principal surface 2*a*.

A plurality of columnar electrodes 24 is provided on one principal surface 2*a* of the substrate 2. In the present embodiment, as illustrated in FIG. 6, 52 columnar electrodes 24 are provided. Note that one columnar electrode 24 may be provided, and may not be provided on the one principal surface 2*a* of the substrate 2.

As illustrated in FIG. 7, the first electronic component 41 is mounted on one principal surface 2*a* of the substrate 2.

The first surface 5*a* of the second electronic component 5 is in contact with the second surface 41*b* of the first electronic component 41. That is, the second electronic component 5 is supported by the second surface 41*b* of the first electronic component 41.

The second electronic component 5 may have a fixing portion for being fixed to the second surface 41*b* of the first electronic component 41. The fixing portion may constitute at least a part of a region of the second surface 41*b* of the second electronic component 5 in contact with the second surface 41*b* of the first electronic component 41. The fixing portion may be made of, for example, a die bonding material having a low dielectric material.

In the present embodiment, the first electronic component 41 and the second electronic component 5 are electronic components constituting at least a part of the transmission circuit. Examples of the electronic component include a low noise amplifier, a surface acoustic wave filter, and a bulk acoustic wave filter. The first electronic component 41 and the second electronic component 5 may be the same electronic component or different electronic components. In the present embodiment, the second electronic component 5 operates in a higher frequency band than the first electronic component 41.

In the example illustrated in FIG. 7, the conductive portion 51 is disposed in the interior 5*d* of the second electronic component 5. However, the conductive portion 51 only needs to be not in contact with the second surface 41*b* of the first electronic component 41, and may be disposed on, for example, the second surface 5*b* and the third surface 5*c* of the second electronic component 5. Furthermore, the conductive portion 51 may be disposed in a region of the first surface 5*a* of the second electronic component 5 that is not in contact with the second surface 41*b* of the first electronic component 41.

When the substrate 2 is viewed from the direction orthogonal to the one principal surface 2*a*, the area of the first electronic component 41 is larger than the area of the second electronic component 5. Therefore, a space 11 is provided between the one principal surface 2*a* of the substrate 2 and the first surface 5*a* of the second electronic component 5.

The plurality of terminals 6 are disposed on the second surface 5*b* of the second electronic component 5. The second surface 5*b* is an example of a non-contact region in the present disclosure.

The plurality of terminals 6 include an external connection terminal 6C in addition to a connection terminal 6A and a ground terminal 6B (not illustrated). In the present embodiment, three connection terminals 6A, one ground terminal 6B, and two external connection terminals 6C are provided.

The external connection terminal 6C is electrically connected to an electrode provided on another substrate on which the electronic circuit module 1B is mounted via an external connection part 84 of the conductor 8 described later.

The resin sheet 7 is disposed across a region of the second surface 5*b* of the second electronic component 5 excluding the plurality of terminals 6, the third surface 5*c* of the second electronic component 5, the connection electrode 3A, and the ground electrode 3B. As a result, the first electronic component 41 and the second electronic component 5 are covered with the resin sheet 7.

The resin sheet 7 is provided with six via conductors 71 corresponding to the three connection electrodes 3A and the three ground electrodes 3B. Note that, in FIG. 7, only two of the six via conductors 71 are illustrated.

The conductor 8 is patterned on the outer surface 7*b* of the resin sheet 7. In the present embodiment, the conductor 8 is a copper foil.

The conductor 8 includes an external connection part 84 in addition to the connection part 81 and the grounding part 82. In the present embodiment, as illustrated in FIG. 6, three connection parts 81, one grounding part 82, and two external connection parts 84 are provided.

As illustrated in FIG. 7, the grounding part 82 is disposed so as to cover the first electronic component 41 and the second electronic component 5. In the present embodiment, the grounding part 82 covers a region of the outer surface 7*b* of the resin sheet 7 excluding a part where the connection part 81 and the external connection part 84 are patterned, a peripheral portion 72 of the connection part 81, and a peripheral portion 73 of the external connection part 84.

Since the grounding part 82 is grounded, electromagnetic waves radiated to the first electronic component 41 and the second electronic component 5 from the outside and electromagnetic waves radiated from the first electronic component 41 and the second electronic component 5 can be shielded.

The grounding part 82 collectively covers the first electronic component 41 and the second electronic component 5. As a result, the number of components of the electronic circuit module 1B can be reduced as compared with a case where a member for shielding an electromagnetic wave is provided in each of the first electronic component 41 and the second electronic component 5.

The external connection part 84 is disposed so as to overlap with the external connection terminal 6C when the substrate 2 is viewed from a direction orthogonal to the one principal surface 2*a*. The external connection part 84 electrically connects the external connection terminal 6C and an electrode provided on another substrate on which the electronic circuit module 1B is mounted. Each of the external connection parts 84 has a circular shape when the substrate 2 is viewed from a direction orthogonal to the one principal surface 2*a*. Note that the shape of each external connection part 84 is not limited to a circular shape, and may be, for example, a polygonal shape.

As illustrated in FIG. 7, the sealing resin 9A covers the electronic component 4, the second electronic component 5, the resin sheet 7, a part of the columnar electrode 24, and a part of the conductor 8. An end of each of the columnar electrodes 24 opposite to an end connected to the land electrode 3 is exposed from the sealing resin 9A.

The conductor 8 includes an inner surface 8*a* facing the second electronic component 5 and an outer surface 8*b* opposite to the inner surface 8*a*. The outer surface 8*b* includes outer surfaces 8*ba* and 8*bb*. The outer surfaces 8*ba* and 8*bb* are surfaces located on the opposite side to the first electronic component 41 with respect to the second electronic component 5 in the thickness direction of the substrate 2. In the present embodiment, the outer surface 8*ba* is exposed from the sealing resin 9A.

The conductor 8 is electrically connected to an electrode provided on another substrate on which the electronic circuit module 1B is mounted via the outer surface 8*ba*.

As a result, power supply and signal transmission are performed between the substrate 2 and the second electronic component 5 and another substrate via the connection part 81. Furthermore, in a case where the connection part 81 is electrically connected to a grounded electrode of another substrate, the connection electrode 3A of the substrate 2 and the connection electrode 3A of the second electronic component 5 are grounded via the connection part 81.

Furthermore, the grounding part 82 is electrically connected to a grounded electrode of another substrate, whereby the ground electrode 3B of the substrate 2 and the ground terminal 6B of the second electronic component 5 are grounded.

Furthermore, by electrically connecting the external connection part 84 to the electrode of the other substrate, power supply and signal transmission are performed between the second electronic component and the other substrate without passing through the substrate 2. Furthermore, in a case where the external connection part 84 is electrically connected to a grounded electrode of another substrate, the external connection terminal 6C of the second electronic component 5 is grounded via the external connection part 84.

The shield member 10 is disposed across the side surface 9Ab of the sealing resin 9A and the top surface 9Ba and the side surface 9Bb of the sealing resin 9B.

According to the second embodiment, the second electronic component 5 is in surface contact with the second surface 41*b* of the first electronic component 41. Therefore, it is possible to suppress displacement of the position and posture of the second electronic component 5 with respect to the first electronic component 41.

According to the second embodiment, the grounding part 82 shields the electromagnetic wave radiated from the outside to the first electronic component 41 and the second electronic component 5. This makes it possible to suppress malfunction of the first electronic component 41 and the second electronic component 5 caused by the electromagnetic wave. Furthermore, the grounding part 82 shields electromagnetic waves radiated from the first electronic component 41 and the second electronic component 5. This makes it possible to suppress the influence of the electromagnetic waves radiated from the first electronic component 41 and the second electronic component 5 from reaching the outside.

According to the second embodiment, the conductor 8 and an electrode provided on another substrate on which the electronic circuit module 1B is mounted can be electrically connected via the outer surface 8*ba* of the conductor 8.

According to the second embodiment, heat generated from the second electronic component 5 and conducted to the conductor 8 is easily dissipated via the outer surface 8*ba*. This can suppress performance degradation due to overheating of the second electronic component 5. Furthermore, it is possible to suppress performance degradation of the first electronic component 41 due to thermal interference of the second electronic component 5 with the first electronic component 41.

According to the second embodiment, the electronic component 4 can also be mounted on the other principal surface 2*b* of the substrate 2. Therefore, the number of electronic components 4 that can be mounted on a fixed area of the substrate 2 increases. Therefore, the size of the substrate 2 can be reduced.

According to the second embodiment, at least a part of the electronic component 4 mounted on the other principal surface 2*b* of the substrate 2 is covered with the shield member 10. This makes it possible to shield the electromagnetic wave radiated to the electronic component 4 mounted on the other principal surface 2*b* of the substrate 2 from the outside and the electromagnetic wave radiated from the electronic component 4. Therefore, malfunction of the electronic component 4 mounted on the other principal surface 2*b* of the substrate 2 can be suppressed. Furthermore, it is possible to suppress the influence of the electromagnetic wave radiated from the electronic component 4 from reaching the outside.

With regard to an electronic component constituting at least a part of the transmission circuit, an electromagnetic wave is likely to affect the outside of the electronic component. According to the second embodiment, the first electronic component 41 and the second electronic component 5 constituting at least a part of the transmission circuit are covered with the grounding part 82. As a result, electromagnetic waves radiated from the first electronic component 41 and the second electronic component 5 are shielded. Therefore, it is possible to suppress the influence of the electromagnetic waves radiated from the first electronic component 41 and the second electronic component 5 constituting at least a part of the transmission circuit from reaching the outside.

As a frequency of a signal handled by the electronic component increases, the influence of the electromagnetic wave radiated from the electronic component easily reaches the outside. That is, among the first electronic component 41 and the second electronic component 5, the electronic component operating in the higher frequency band is more likely to, due to the electromagnetic wave, affect the outside than the other electronic component.

According to the second embodiment, the second electronic component 5 operates in a higher frequency band than the first electronic component 41. The second electronic component 5 is disposed closer to the conductor 8 than the first electronic component 41 in the thickness direction of the substrate 2. Therefore, the electromagnetic wave radiated from the second electronic component 5 is more easily shielded by the grounding part 82 than the electromagnetic wave radiated from the first electronic component 41. Therefore, it is possible to secure the shielding property with respect to the second electronic component 5 that is likely to affect the outside due to the electromagnetic wave.

According to the second embodiment, the space 11 is provided between the substrate 2 and the second electronic component 5. Therefore, the electronic component 4 mounted on the one principal surface 2a of the substrate 2 can be accommodated in the space 11.

According to the second embodiment, the part of the conductor 8 patterned in the resin sheet 7 does not contact the surface of the first electronic component 41 and the surface of the second electronic component 5. Therefore, a member that needs to be disposed away from the conductor 8, for example, a wiring pattern or the like constituting at least a part of the electronic circuit can be disposed on the surface of the first electronic component 41 and the surface of the second electronic component 5. Therefore, electronic components having various configurations can be used for the first electronic component 41 and the second electronic component 5.

Modification of Second Embodiment

Figure 8:
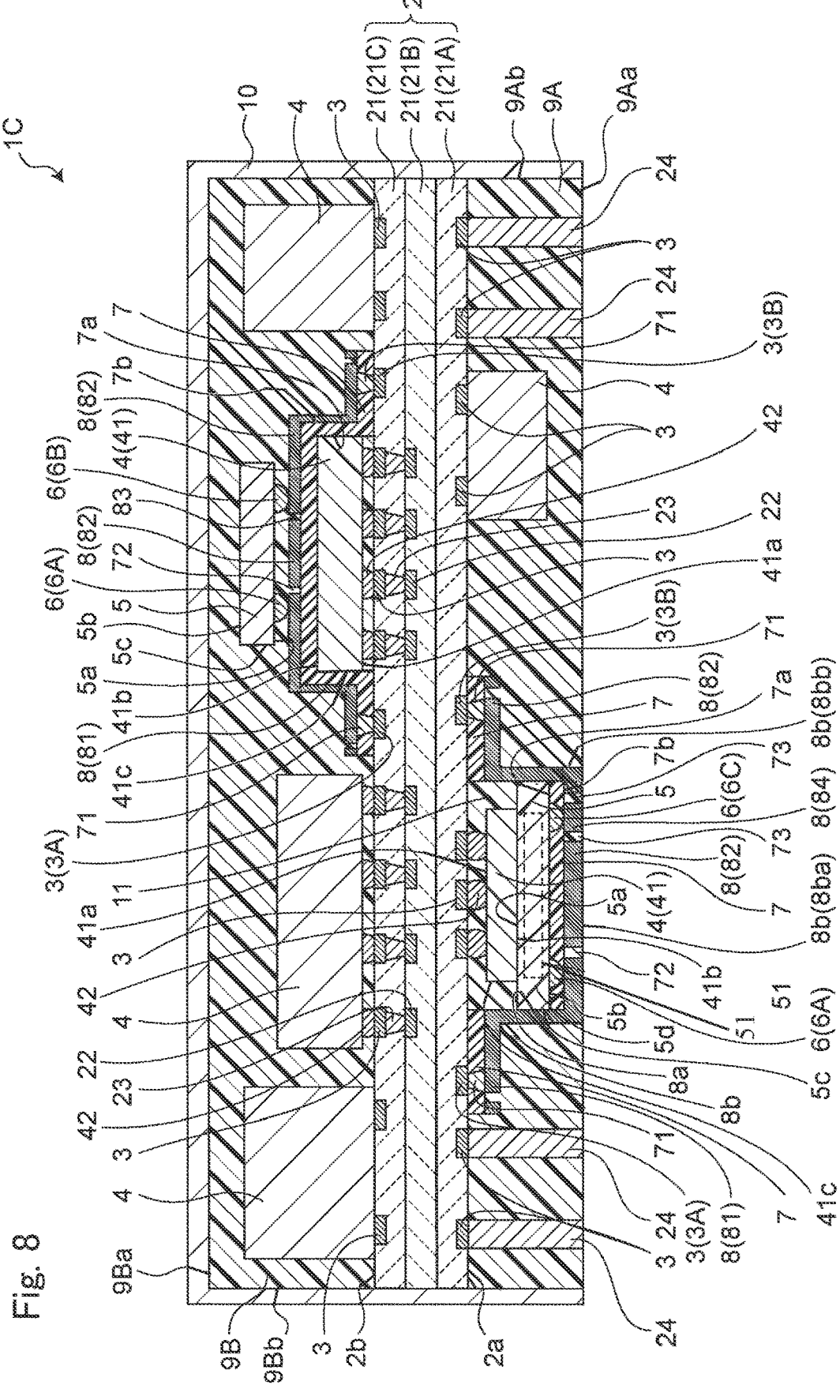
FIG. 8 is a cross-sectional view illustrating a cross section at a position corresponding to line VII-VII in FIG. 6 of a modification of the electronic circuit module according to the second embodiment of the present disclosure.

FIG. 8 is a cross-sectional view illustrating a cross section at a position corresponding to line VII-VII in FIG. 6 of a modification of the electronic circuit module according to the second embodiment of the present disclosure. In an electronic circuit module 1C illustrated in FIG. 8, the resin sheet 7 is disposed in a region of the second surface 41b of the second electronic component 5 excluding the plurality of terminals 6, the connection electrode 3A, and the ground electrode 3B. On the other hand, the resin sheet 7 is not disposed on the third surface 5c of the second electronic component 5. Therefore, the conductor 8 is in contact with the third surface 5c of the second electronic component 5.

According to the modification of the second embodiment, at least a part of the conductor 8 is in contact with at least one of the surface of the first electronic component 41 and the surface of the second electronic component 5. Therefore, heat generated from the electronic component in contact with the conductor 8 is easily conducted to the conductor and dissipated. This can suppress performance degradation due to overheating of the electronic component in contact with the conductor 8. Furthermore, it is possible to suppress thermal interference of the electronic component in contact with the conductor with the electronic component disposed in the vicinity thereof. Therefore, deterioration in performance of the electronic component can be suppressed.

Note that the present disclosure is not limited to the above-described embodiment, and can be implemented in various other modes. In the second embodiment and each embodiment described later, each connection electrode 3A and each ground electrode 3B are disposed outside the second electronic component 5 when the substrate 2 is viewed from the direction orthogonal to the one principal surface 2a, but the present disclosure is not limited thereto.

For example, each connection electrode 3A and each ground electrode 3B may be disposed at a position overlapping the second electronic component 5 when the substrate 2 is viewed from a direction orthogonal to the one principal surface 2a.

In the second embodiment and each embodiment described later, the second electronic component 5 operates in a higher frequency band than the first electronic component 41, but the present disclosure is not limited thereto. The second electronic component 5 may operate in a frequency band lower than that of the first electronic component 41.

In the second embodiment and each embodiment described later, when the substrate 2 is viewed from the direction orthogonal to the one principal surface 2a, the area of the first electronic component 41 is larger than the area of the second electronic component 5, but the present disclosure is not limited thereto. The area of the first electronic component 41 may be equal to or smaller than the area of the second electronic component 5.

In the second embodiment and each embodiment described later, the first surface 5a of the second electronic component 5 corresponds to the non-contact region in the present disclosure. However, the non-contact region may be any region of the surface of the second electronic component 5 that is not in contact with the first electronic component 41. For example, the non-contact region may be a region of the third surface 5c of the second electronic component 5 and the first surface 5a of the second electronic component 5 that is not in contact with the first electronic component 41.

In the second embodiment and each embodiment described later, the number of the external connection parts 84 is not limited to two, and may be one or three or more. Furthermore, the conductor 8 may not have the external connection part 84.

In the second embodiment and each embodiment described later, the number of external connection terminals 6C is not limited to two, and may be one or three or more. Furthermore, the external connection terminal 6C may not be provided in the second electronic component 5.

In the second embodiment and each embodiment described later, the sealing resin 9A covers the electronic component 4, the second electronic component 5, and the resin sheet 7, but the present disclosure is not limited thereto. For example, the sealing resin 9A may cover only some of the electronic component 4, the second electronic component 5, and the resin sheet 7. Furthermore, for example, the sealing resin 9A may cover only a part of the surface of each member.

In the second embodiment, the outer surface 8ba of the conductor 8 is exposed from the sealing resin 9A, but the present disclosure is not limited thereto. In the outer surface 8b, at least a part of a surface located on the opposite side of the first electronic component 41 with respect to the second electronic component 5 in the thickness direction of the substrate 2 may be exposed from the sealing resin 9A. For example, the outer surfaces 8ba and 8bb may be exposed from the sealing resin 9A.

In the second embodiment and each embodiment described later, the shield member 10 is disposed across the side surface 9Ab of the sealing resin 9A and the top surface 9Ba and the side surface 9Bb of the sealing resin 9B, but the present disclosure is not limited thereto. For example, the shield member 10 may be disposed in a region of the top surface 9Aa of the sealing resin 9A excluding a part where the conductor 8 and the columnar electrode 24 are exposed from the sealing resin 9A. Furthermore, the shield member 10 may not be provided in the electronic circuit module 1B.

In the modification of the second embodiment, the conductor 8 is in contact with the third surface 5*c* of the second electronic component 5, but the present disclosure is not limited thereto. For example, the conductor 8 may be in contact with the third surface 41*c* of the first electronic component 41.

Third Embodiment

Figure 9:
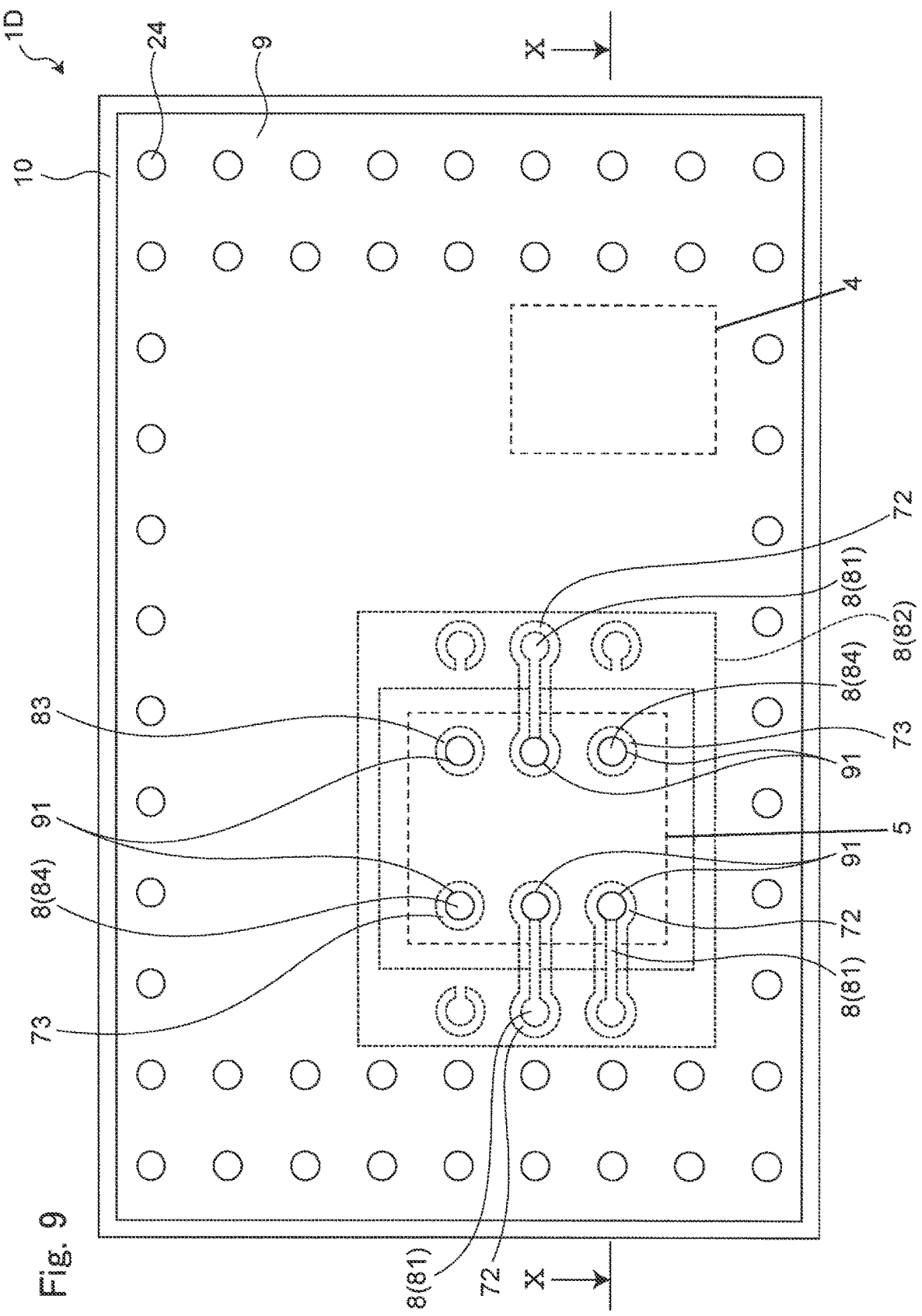
FIG. 9 is a bottom view of an electronic circuit module according to a third embodiment of the present disclosure.
Figure 10:
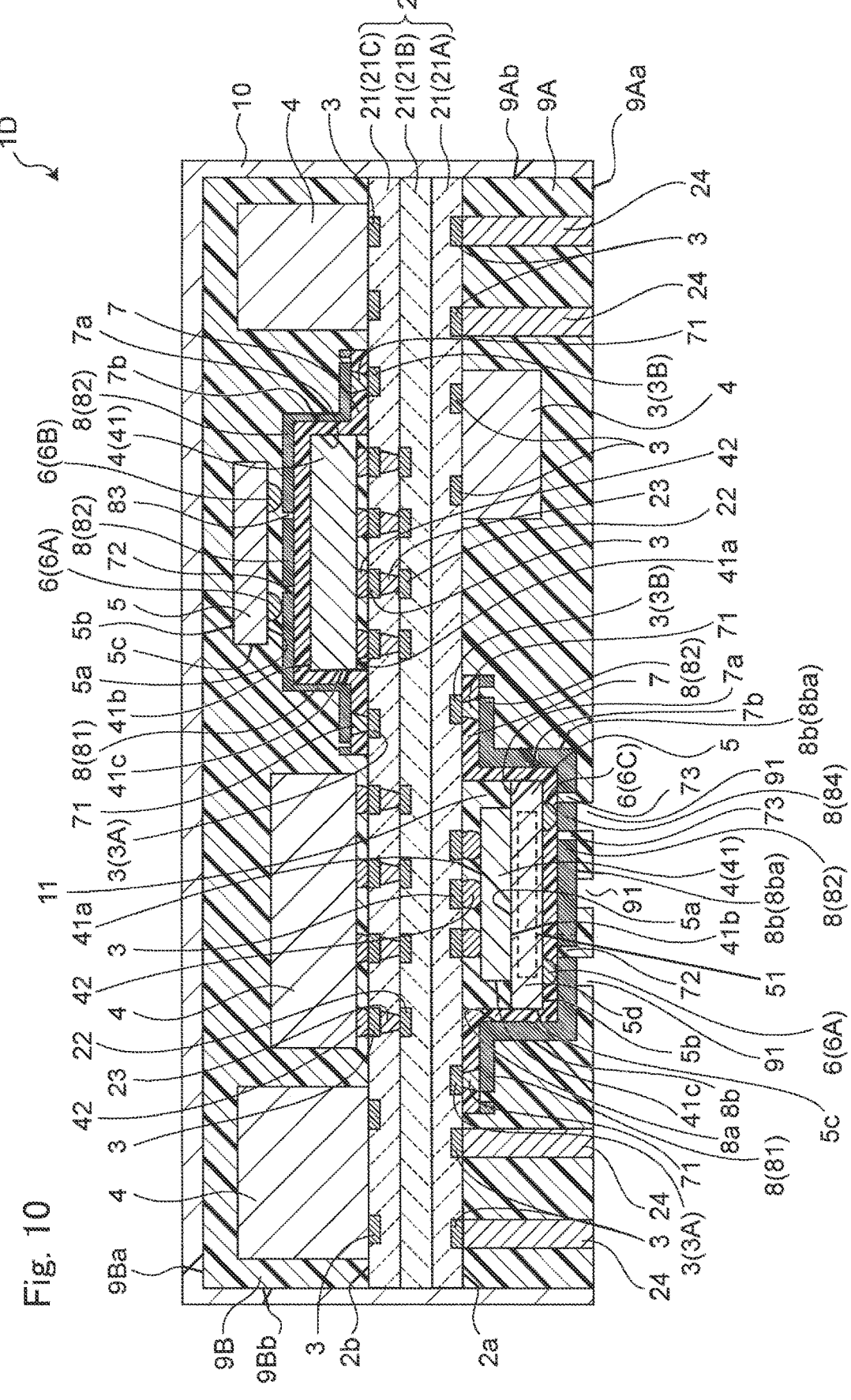
FIG. 10 is a cross-sectional view of the electronic circuit module of FIG. 9 taken along line X-X.

FIG. 9 is a bottom view of an electronic circuit module according to a third embodiment of the present disclosure. FIG. 10 is a cross-sectional view of the electronic circuit module of FIG. 9 taken along line X-X;

An electronic circuit module 1D according to the third embodiment is different from the electronic circuit module 1B according to the second embodiment in that a through hole 91 is formed in a sealing resin 9A as illustrated in FIGS. 9 and 10.

As illustrated in FIG. 9, the sealing resin 9A covers the conductor 8.

As illustrated in FIG. 10, the through hole 91 through which the conductor 8 communicates with the outside of the sealing resin 9A is formed in the sealing resin 9A. In the present embodiment, as illustrated in FIG. 9, six through holes 91 are formed. Each of the through holes 91 is disposed at a position overlapping the second electronic component 5 when the substrate 2 is viewed from a direction orthogonal to the one principal surface 2*a*.

As illustrated in FIG. 10, each of the through holes 91 extends from the top surface 9Aa of the sealing resin 9A to the conductor 8. That is, the bottom part of each through hole 91 is formed of the conductor 8.

Note that the present disclosure is not limited to the above-described embodiment, and can be implemented in various other modes. In the third embodiment and a fourth embodiment described later, the number of the through holes 91 is not limited to six, and may be one to five or seven or more. Furthermore, the through hole 91 may not be formed in the sealing resin 9A.

In the third embodiment and the fourth embodiment described later, the sealing resin 9A covers all of the conductor 8 except for the part where the through hole 91 is formed, but the present disclosure is not limited thereto. The sealing resin 9A may cover a part of the conductor 8.

In the third embodiment and a fourth embodiment described later, the bottom part of the through hole 91 is formed of the conductor 8, but the present disclosure is not limited thereto. The through hole 91 may communicate the conductor 8 with the outside of the sealing resin 9A. For example, the through hole 91 may penetrate the sealing resin 9A and the conductor 8. In this case, the conductor 8 is exposed from the sealing resin 9A surrounding each through hole 91 in the direction parallel to the substrate 2.

In a case where the electronic circuit module 1D is mounted on another substrate, the conductor 8 and an electrode provided on the other substrate can be electrically connected via solder. At this time, when the solder wets and spreads, the electrodes provided on the conductor 8 and the other substrate may be short-circuited with the other member. On the other hand, according to the third embodiment, by disposing solder in the through hole 91 and melting the solder, it is possible to electrically connect the conductor 8 and an electrode provided on another substrate while suppressing wetting and spreading of the solder. Therefore, mounting failure of the electronic circuit module 1D can be suppressed.

Fourth Embodiment

Figure 11:
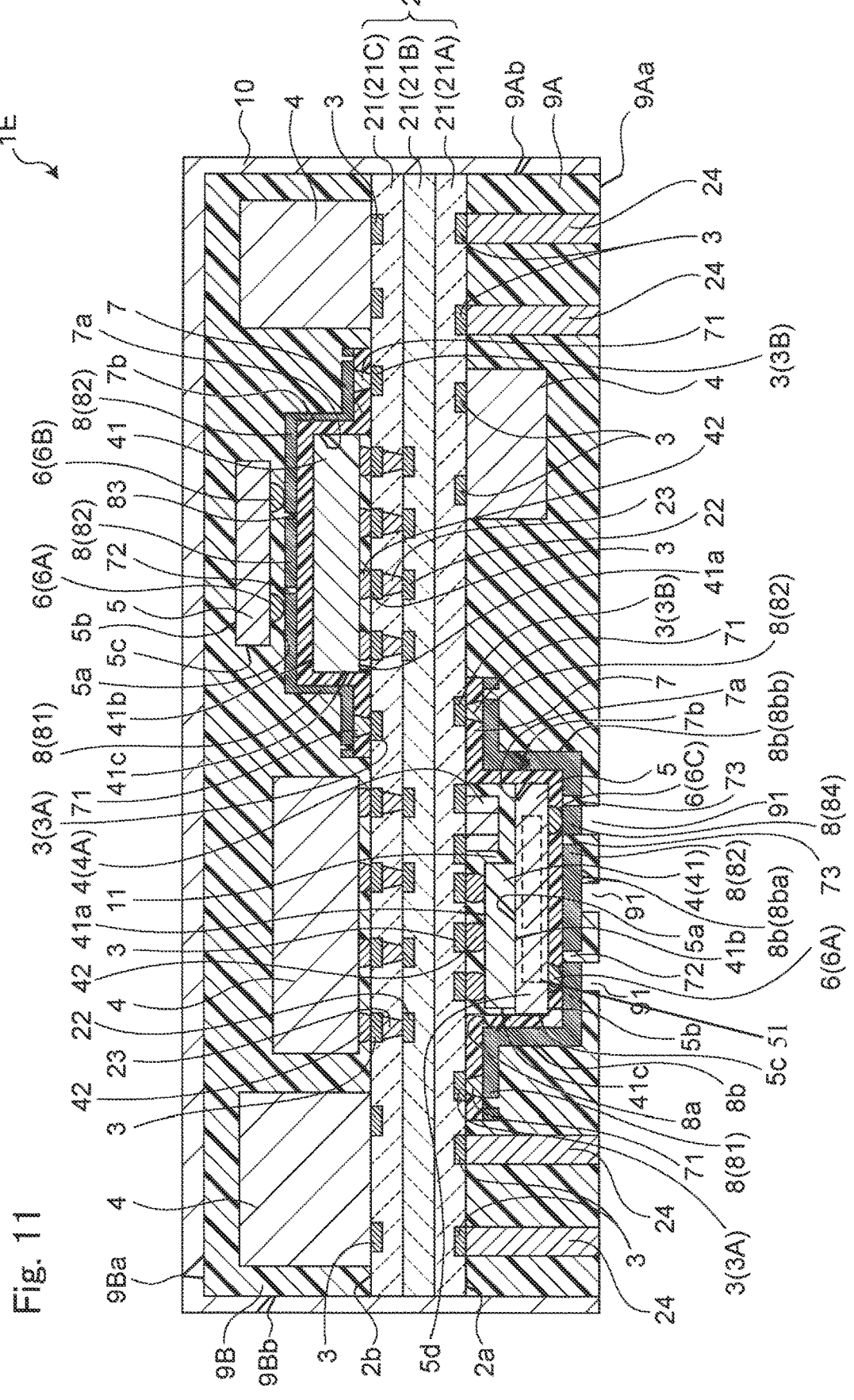
FIG. 11 is a cross-sectional view illustrating a cross section of an electronic circuit module according to a fourth embodiment of the present disclosure at a position corresponding to line X-X in FIG. 9.

FIG. 11 is a cross-sectional view illustrating a cross section of an electronic circuit module according to a fourth embodiment of the present disclosure at a position corresponding to the line X-X in FIG. 9.

An electronic circuit module 1E according to the fourth embodiment is different from the electronic circuit module 1D according to the third embodiment in that an electronic component 4A mounted on one principal surface 2*a* of a substrate 2 is disposed in a space 11 between the substrate 2 and a second electronic component 5.

In the fourth embodiment, the electronic component 4 includes an electronic component 4A. As illustrated in FIG. 11, the electronic component 4A is disposed in the space 11 between the substrate 2 and the second electronic component 5. In the present embodiment, the electronic component 4A is connected to the two land electrodes 3 provided on the one principal surface 2*a* of the substrate 2.

At least a part of the electronic component 4A is covered with the grounding part 82. As a result, the electromagnetic wave radiated from the outside to the electronic component 4A is shielded by the grounding part 82. Furthermore, the grounding part 82 shields the electromagnetic wave radiated from the electronic component 4A. As a result, it is possible to suppress the influence of the electromagnetic wave radiated from the electronic component 4A from reaching the outside.

In the present embodiment, the electronic component 4A is an electronic component constituting at least a part of an impedance matching circuit. Examples of the electronic component include an inductor and a capacitor. Note that the electronic component 4A may be an electronic component other than the electronic components exemplified above. Furthermore, the electronic component 4A may be the same electronic component as the first electronic component 41, or may be a different electronic component.

According to the fourth embodiment, the electronic component 4 mounted on the one principal surface 2*a* of the substrate 2 is disposed in the space 11 between the substrate 2 and the second electronic component 5. This increases the number of electronic components 4 that can be mounted on a fixed area of the one principal surface 2*a* of the substrate 2. Therefore, the area of the one principal surface 2*a* of the substrate 2 can be reduced.

Note that by appropriately combining arbitrary embodiments from the various embodiments described above, the effects of the respective embodiments can be achieved.

Although the present disclosure has been fully described in connection with preferred embodiments with reference to the accompanying drawings, various changes and modifications will be apparent to those skilled in the art. Such variations and modifications should be understood to be included within the scope of the present disclosure according to the appended claims as long as they do not depart therefrom.

The electronic circuit module according to the present disclosure is useful for an electronic circuit module in which two electronic components are arranged so as to overlap each other in the thickness direction of the substrate because the displacement in the position and posture of the second electronic component is suppressed.

1, 1A-1E electronic circuit module 2 substrate

2*a* one principal surface

2*b* the other principal surface 3 land electrode 3A connection electrode
4, 4A electronic component
41 first electronic component
41a first surface
41b second surface
5, 5A second electronic component
5a first surface
5d interior
51 conductive portion
6 terminal
6A connection terminal
7 resin sheet
8 conductor
81 connection part
82 grounding part
9, 9A, 9B sealing resin
91 through hole
10 shield member
11 space

The invention claimed is:

1. An electronic circuit module comprising:
a substrate;
a first electronic component mounted on one principal surface of the substrate;
a substrate electrode provided on the one principal surface;
a second electronic component supported by a support surface opposite to a surface of the first electronic component facing the one principal surface;
a component electrode provided on a surface of the second electronic component; and
a conductor including a connection part connecting the substrate electrode and the component electrode, wherein:
the second electronic component includes a conductive portion electrically connected to the component electrode,
the conductive portion is separated from a support surface of the first electronic component,
the second electronic component is in surface contact with the support surface of the first electronic component,
the component electrode is disposed in a non-contact region not in contact with the first electronic component on the surface of the second electronic component, and
the conductor comprises a grounding part disposed so as to cover the first electronic component and the second electronic component, and is electrically connected to a ground to shield an electromagnetic wave.

2. The electronic circuit module according to claim 1, wherein the second electronic component is supported on the support surface of the first electronic component via the component electrode.

3. The electronic circuit module according to claim 1, wherein the first electronic component is an electronic component constituting at least a part of a transmission circuit.

4. The electronic circuit module according to claim 1, further comprising a first sealing resin provided on the one principal surface and covering at least a part of the first electronic component, at least a part of the second electronic component, and a part of the conductor, wherein at least a part of a surface of the conductor opposite to a surface facing the second electronic component, the surface being located on an opposite side to the first electronic component with respect to the second electronic component in a thickness direction of the substrate, is exposed from the first sealing resin provided on the one principal surface.

5. The electronic circuit module according to claim 1, further comprising a first sealing resin provided on the one principal surface and covering at least a part of the first electronic component, at least a part of the second electronic component, and at least a part of the conductor, wherein a through hole through which the conductor communicates with an outside of the first sealing resin provided on the one principal surface is provided in the first sealing resin provided on the one principal surface.

6. The electronic circuit module according to claim 1, wherein the first electronic component and the second electronic component are electronic components constituting at least a part of a transmission circuit.

7. The electronic circuit module according to claim 1, wherein, when the substrate is viewed from a direction orthogonal to the one principal surface, an area of the second electronic component is larger than an area of the first electronic component.

8. The electronic circuit module according to claim 1, further comprising a resin sheet disposed so as to cover at least one of at least a part of the first electronic component and at least a part of the second electronic component, wherein at least a part of the conductor is patterned on a surface of the resin sheet opposite to a surface facing the first electronic component and the second electronic component.

9. The electronic circuit module according to claim 1, wherein at least a part of the conductor is in contact with at least one of the surface of the first electronic component and the surface of the second electronic component.

10. The electronic circuit module according to claim 2, further comprising a resin sheet disposed so as to cover at least a part of the first electronic component, wherein at least a part of the conductor is patterned on a surface of the resin sheet opposite to a surface facing the first electronic component.

11. The electronic circuit module according to claim 2, wherein at least a part of the conductor is in contact with a surface of the first electronic component.

12. The electronic circuit module according to claim 3, wherein the first electronic component is a power amplifier, a surface acoustic wave filter, or a bulk acoustic wave filter.

13. The electronic circuit module according to claim 3, wherein
the second electronic component is an electronic component constituting at least a part of a transmission circuit, and
the first electronic component operates in a higher frequency band than the second electronic component.

14. The electronic circuit module according to claim 4, wherein
the substrate further comprises another principal surface opposite to the one principal surface, and
the electronic circuit module further comprises:
a third electronic component mounted on another principal surface;
a second sealing resin provided on the other principal surface and covering at least a part of the third electronic component mounted on the other principal surface; and
a shield member covering a surface of the second sealing resin provided on the other principal surface, the surface of the second sealing resin being opposite to the surface in contact with the other principal surface.

15. The electronic circuit module according to claim 6, wherein the second electronic component operates in a higher frequency band than the first electronic component.

16. The electronic circuit module according to claim 7, wherein another electronic component mounted on the one principal surface is disposed in a space provided between the substrate and the second electronic component.

17. The electronic circuit module according to claim 12, wherein the second electronic component is an electronic component constituting at least a part of a transmission circuit, and the first electronic component operates in a higher frequency band than the second electronic component.

\* \* \* \* \*